(12) United States Patent　(10) Patent No.: US 8,786,103 B2
Uchiyama et al.　(45) Date of Patent: Jul. 22, 2014

(54) STACKED CHIPS PACKAGE HAVING FEED-THROUGH ELECTRODE CONNECTING THE FIRST AND SECOND SEMICONDUCTOR COMPONENTS VIA AN ADHESIVE LAYER

(75) Inventors: Kenta Uchiyama, Nagano (JP); Akihiko Tateiwa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 503 days.

(21) Appl. No.: 12/755,515

(22) Filed: Apr. 7, 2010

(65) Prior Publication Data

US 2010/0258944 A1　Oct. 14, 2010

(30) Foreign Application Priority Data

Apr. 13, 2009　(JP) ................................ 2009-096741

(51) Int. Cl.
*H01L 23/538*　(2006.01)

(52) U.S. Cl.
USPC ............... 257/777; 257/783; 257/E23.174; 257/E23.178

(58) Field of Classification Search
CPC ........... H01L 23/5384; H01L 23/5385; H01L 23/5389; H01L 24/24; H01L 24/82; H01L 24/96
USPC ................. 257/777, E23.169, E23.174, 773, 257/E23.178
See application file for complete search history.

(56) References Cited

U.S. PATENT DOCUMENTS

| | | | | |
|---|---|---|---|---|
| 5,111,278 A * | 5/1992 | Eichelberger | ................. | 257/698 |
| 5,353,498 A * | 10/1994 | Fillion et al. | .................... | 29/840 |
| 6,582,992 B2 * | 6/2003 | Poo et al. | ...................... | 438/109 |
| 6,873,054 B2 * | 3/2005 | Miyazawa et al. | ............ | 257/774 |
| 7,598,607 B2 * | 10/2009 | Chung et al. | .................. | 257/686 |
| 8,174,109 B2 * | 5/2012 | Uchiyama | .................... | 257/686 |
| 8,237,259 B2 * | 8/2012 | Pressel et al. | ................. | 257/700 |
| 2002/0137263 A1 * | 9/2002 | Towle et al. | .................. | 438/127 |
| 2006/0120056 A1 * | 6/2006 | Sasaki | ........................... | 361/735 |
| 2007/0035033 A1 * | 2/2007 | Ozguz et al. | .................. | 257/777 |
| 2008/0308921 A1 * | 12/2008 | Kim | ............................. | 257/686 |
| 2009/0039491 A1 * | 2/2009 | Kim et al. | ...................... | 257/686 |
| 2009/0085192 A1 * | 4/2009 | Hsu et al. | ...................... | 257/700 |
| 2010/0213616 A1 * | 8/2010 | Uchiyama | .................... | 257/773 |
| 2010/0252937 A1 * | 10/2010 | Uchiyama | .................... | 257/777 |

FOREIGN PATENT DOCUMENTS

| | | |
|---|---|---|
| JP | 07-007134 | 1/1995 |
| JP | 10-229161 | 8/1998 |
| JP | 2005-317903 | 11/2005 |

OTHER PUBLICATIONS

Office Action dated Oct. 23, 2012 issued with respect to the basic Japanese Patent Application No. 2009-096741.

* cited by examiner

*Primary Examiner* — Anh Mai

(74) *Attorney, Agent, or Firm* — IPUSA, PLLC

(57) ABSTRACT

A first semiconductor component and a second semiconductor component are attached together via an adhesion layer so that the first semiconductor component and the second semiconductor component are electrically connected with each other via a through electrode. The through electrode is formed to fill a through hole formed in the second semiconductor component and a through hole formed in a portion the adhesion layer. The through hole formed in the portion the adhesion layer is positioned between the through hole formed in the second semiconductor component and a second connection surface of a first semiconductor component through electrode.

8 Claims, 28 Drawing Sheets

FIG. 20

STACKED CHIPS PACKAGE HAVING
FEED-THROUGH ELECTRODE
CONNECTING THE FIRST AND SECOND
SEMICONDUCTOR COMPONENTS VIA AN
ADHESIVE LAYER

BACKGROUND OF THE INVENTION

1. Field of the Invention

The present invention relates to an electronic apparatus and fabrication method of the same, specifically to an electronic apparatus provided with a first semiconductor component having a first electronic part and a first multilayer wiring structure electrically connected to the first electronic part, and a second semiconductor component having a second electronic part and a second multilayer wiring structure electrically connected to the second electronic part.

2. Description of the Related Art

FIG. 1 is a cross-sectional-view of a related art electronic apparatus.

Referring to FIG. 1, a related art electronic apparatus 300 includes a first semiconductor component 301, a second semiconductor component 302, and an inner connection terminal 303. The first semiconductor component 301 includes a wiring substrate (first multilayer wiring structure) 311, a first electronic part 312, an underfill resin 313, and external connection terminals 314.

The wiring substrate 311 is a plate-like multilayer wiring structure, which includes insulation layers 316, 317, patterned wirings 319, 328, 329, pads 321, solder resist layers 322, 326, and external connection pads 323, 324. The insulation layer 316 is provided on an upper surface 317A of the insulation layer 317.

The patterned wirings 319 and the pads 321 are provided on an upper surface 316A of the insulation layer 316. The patterned wiring 319 includes pad portions 332, 333 that are exposed through the solder resist layer 322. The pad 321 is exposed through the solder resist layer 322.

The solder resist layers 322 are provided on the upper surface 316A of the insulation layer 316. The external connection pads 323, 324 are provided on a lower surface 317B of the insulation layer 317. Lower surfaces of the external connection pads 323, 324 are exposed through the solder resist layer 326.

The solder resist layer 326 is provided on the lower surface 317B of the insulation layer 317. The patterned wirings 328, 329 are provided inside the insulation layers 316, 317 that are stacked with each other. The patterned wirings 328 are connected to the pad portions 333 and the external connection pads 323. The patterned wirings 329 are connected to the pads 321 and the external connection pads 324.

The first electronic part 312 is arranged between the first semiconductor component 301 and the second semiconductor component 302. The first electronic part 312 includes electrode pads 336, which are electrically connected to the pad portions 332 via bumps (e.g., solder bumps) 337.

The underfill resin 313 is provided in order to fill a gap between the first electronic part 312 and the wiring substrate 311. The external connection terminals 314 are provided on a lower surface of the external connection pads 323, 324.

The second semiconductor component 302 is arranged above the first semiconductor component 301. The second semiconductor component 302 includes a wiring substrate (second multilayer wiring structure) 341, a second electronic part 343, and a mold resin 346. The wiring substrate 341 has a plate shape, and includes pads 351, 352, 354. The pads 351 oppose the pad portions 333 and are electrically connected to the pad portions 333 via inner connection terminals 303. The pads 352 oppose the pads 321 and are electrically connected to the pads 321 via the inner connection terminals 303. The pads 354 are electrically connected to the pads 351 or the pads 352.

The second electronic part 343 is affixed on the wiring substrate 341, and electrically connected to the pads 354 via metal wiring 344. The mold resin 346 is provided on the wiring substrate 341 and seals the metal wiring 344 and the second electronic part 343.

The inner connection terminals 303 have sufficient heights so that the first electronic part 312 and the second semiconductor component 302 are not in contact with each other. The heights of the inner connection terminals 303 are, for example, 200 μm (see Patent Document 1).

Patent Document 1: Japanese Patent Application Laid-Open Publication H06-13541.

However, there is a problem in that a thickness of the related art electronic apparatus 300 is inevitably increased because the first electronic part 312 arranged on the wiring substrate 311 is electrically connected to the wiring substrate 311 in the electronic device 300.

In addition, another cause of such a problem is that the heights (or diameters) of the inner connection terminals 303 that connect the first semiconductor component 301 with the second semiconductor component 302 need to be greater than a summation of the thickness of the first electronic part 312 and heights of the bumps 337 in the related art electronic apparatus 300.

Moreover, there is a problem in that electrical connection between the first semiconductor component 301 and the second semiconductor component 302 is not sufficiently reliable in some cases when the solder balls are used as the inner connection terminals 303.

Incidentally, the problem of an increased thickness of the electronic apparatus 300 may be raised when the first electronic part 313 and the wiring substrate 311 are electrically, connected by wire-bonding.

SUMMARY OF THE INVENTION

The present invention has been made in view of the above, and provides an electronic apparatus and a fabrication method of the same that are capable of reducing a thickness of the electronic apparatus configured with a first semiconductor component and a second semiconductor component that are stacked one on the other, and capable of improving reliability of electrical connection between the first semiconductor component and the second semiconductor component.

Accordingly, a first aspect of the present invention provides an electronic apparatus comprising a first semiconductor component, a second semiconductor component, an adhesion layer, and a third through electrode. The first semiconductor component includes a first electronic part including a first electrode pad forming surface on which a first electrode pad is formed, and a first back surface opposing the first electrode pad forming surface, a first insulation member including one surface and an opposing surface, the first insulation member sealing a side surface of the first electronic part so that the first electrode pad forming surface and the first back surface of the first electronic part are exposed at the one surface and the opposing surface, respectively, of the first insulation member, a first multilayer wiring structure including plural insulation layers that are stacked one above another in order to cover the one surface of the first insulation member and the first electrode pad forming surface, and a first patterned wiring, and a first through electrode configured to go through the first insulation member, wherein the first patterned wiring is connected to the first electrode pad and the first through electrode. The second semiconductor component includes a second electronic part including a second electrode pad forming surface on which a second electrode pad is formed, and a second back surface opposing the second electrode pad forming surface, a second insulation member including one surface and an opposing surface, the second insulation member sealing a side surface of the second electronic part so that the second electrode pad forming surface and the second back surface of the second electronic part are exposed at the one surface and the opposing surface, respectively, of the second insulation member, a second multilayer wiring structure including plural insulation layers that are stacked one above another in order to cover the one surface of the second insulation member and the second electrode pad forming surface, and a second patterned wiring, and a second through electrode that is provided on an inner surface of a first through hole formed to go through the second insulation member and the second multilayer wiring structure, and includes a second through hole formed in a center portion of the second through electrode, wherein the second patterned wiring is connected to the second electrode pad and the second through electrode. The adhesion layer is provided between the opposing surface of the first insulation member and the second multilayer wiring structure, thereby stacking the first semiconductor component and the second semiconductor component one above the other. The third through electrode is configured to fill the second through hole and a third through hole that is formed integrally with the second through hole in the adhesion layer, thereby connecting the first through electrode and the second through electrode.

A second aspect of the present invention provides an electronic apparatus comprising a first semiconductor component, a second semiconductor component, an adhesion layer, and a through electrode. The first semiconductor component includes a first electronic part including a first electrode pad forming surface on which a first electrode pad is formed, and a first back surface opposing the first electrode pad forming surface, a first insulation member including one surface and an opposing surface, the first insulation member sealing a side surface of the first electronic part so that the first electrode pad forming surface and the first back surface of the first electronic part are exposed at the one surface and the opposing surface, respectively, of the first insulation member, and a first multilayer wiring structure including plural insulation layers that are stacked one above another in order to cover the one surface of the first insulation member and the first electrode pad forming surface, and a first patterned wiring, wherein the first patterned wiring is connected to the first electrode pad. The second semiconductor component includes a second electronic part including a second electrode pad forming surface on which a second electrode pad is formed, and a second back surface opposing the second electrode pad forming surface, a second insulation member including one surface and an opposing surface, the second insulation member sealing a side surface of the second electronic part so that the second electrode pad forming surface and the second back surface of the second electronic part are exposed at the one surface and the opposing surface, respectively, of the second insulation member, and a second multilayer wiring structure including plural insulation layers that are stacked one above another in order to cover the one surface of the second insulation member and the second electrode pad forming surface, and a second patterned wiring, wherein the second patterned wiring is connected to the second electrode pad. The adhesion layer is provided between the opposing surface of the first insulation member and the second multilayer wiring structure, thereby stacking the first semiconductor component and the second semiconductor component one above the other. The through electrode is configured to go through the first multilayer wiring structure, the first insulation member, the adhesion layer, the second multilayer wiring structure, and the second insulation member, thereby connecting the first patterned wiring and the second patterned wiring.

A third aspect of the present invention provides a method of fabricating an electronic apparatus. The method comprises steps of fabricating a first semiconductor component, fabricating a second semiconductor component, applying an adhesion layer, forming a third through hole, and forming a third through electrode. In the first semiconductor component forming step, there is fabricated a first semiconductor component, a first electronic part includes a first electrode pad forming surface on which a first electrode pad is formed, and a first back surface opposing the first electrode pad forming surface, a first insulation member including one surface and an opposing surface, the first insulation member sealing a side surface of the first electronic part so that the first electrode pad forming surface and the first back surface of the first electronic part are exposed at the one surface and the opposing surface, respectively, of the first insulation member, a first multilayer wiring structure including plural insulation layers that are stacked one above another in order to cover the one surface of the first insulation member and the first electrode pad forming surface, and a first patterned wiring, and a first through electrode configured to go through the first insulation member, wherein the first patterned wiring is connected to the first electrode pad and the first through electrode. In the second semiconductor component forming step, there is fabricated a second semiconductor component including a second electronic part including a second electrode pad forming surface on which a second electrode pad is formed, and a second back surface opposing the second electrode pad forming surface, a second insulation member including one surface and an opposing surface, the second insulation member sealing a side surface of the second electronic part so that the second electrode pad forming surface and the second back surface of the second electronic part are exposed at the one surface and the opposing surface, respectively, of the second insulation member, and a second multilayer wiring structure including plural insulation layers that are stacked one above another in order to cover the one surface of the second insulation member and the second electrode pad forming surface, and a second patterned wiring, wherein the second patterned wiring is connected to the second electrode pad. In the semiconductor component attaching step, an adhesion layer is applied between the opposing surface of the first insulation member and the second multilayer wiring structure, thereby stacking the first semiconductor component and the second semiconductor component one above the other. In the third through hole forming step, there is formed a third through hole that goes through the adhesion layer and is formed integrally with the second through hole. In the third through electrode forming step, there is formed a third through electrode to be connected to the first through electrode and the second through electrode, in the second through hole and the third through hole.

A fourth aspect of the present invention provides a method of fabricating an electronic apparatus. This method comprises steps of fabricating a first semiconductor component, fabricating a second semiconductor component, applying an adhesion layer, forming a through hole, and forming a through electrode. In the first semiconductor component forming step, there is fabricated a first semiconductor component including a first electronic part including a first electrode pad forming surface on which a first electrode pad is formed, and a first back surface opposing the first electrode pad forming surface, a first insulation member including one surface and an opposing surface, the first insulation member sealing a side surface of the first electronic part so that the first electrode pad forming surface and the first back surface of the first electronic part are exposed at the one surface and the opposing surface, respectively, of the first insulation member, and a first multilayer wiring structure including plural insulation layers that are stacked one above another in order to cover the one surface of the first insulation member and the first electrode pad forming surface, and a first patterned wiring, wherein the first patterned wiring is connected to the first electrode pad. In the second semiconductor component forming step, there is fabricated a second semiconductor component including a second electronic part including a second electrode pad forming surface on which a second electrode pad is formed, and a second back surface opposing the second electrode pad forming surface, a second insulation member including one surface and an opposing surface, the second insulation member sealing a side surface of the second electronic part so that the second electrode pad forming surface and the second back surface of the second electronic part are exposed at the one surface and the opposing surface, respectively, of the second insulation member, and a second multilayer wiring structure including plural insulation layers that are stacked one above another in order to cover the one surface of the second insulation member and the second electrode pad forming surface, and a second patterned wiring, wherein the second patterned wiring is connected to the second electrode pad. In the semiconductor component attaching step, an adhesion layer is applied between the opposing surface of the first insulation member and the second multilayer wiring structure, thereby stacking the first semiconductor component and the second semiconductor component one above the other. In the through hole forming step, there is formed a through hole that goes through the first multilayer wiring structure, the first insulation member, the adhesion layer, the second multilayer wiring structure, the second insulation member, the first patterned wiring, and the second patterned wiring; and a through electrode forming step of forming a through electrode to be connected to the first patterned wiring and the second patterned wiring, in the through hole.

According to an embodiment of the present invention, there are provided an electronic apparatus and a fabrication method of the same that are capable of reducing a thickness of the electronic apparatus configured with a first semiconductor component and a second semiconductor component that are stacked one on the other, and improving reliability of electrical connection between the first semiconductor component and the second semiconductor component.

BRIEF DESCRIPTION OF THE DRAWINGS

Figure 20:
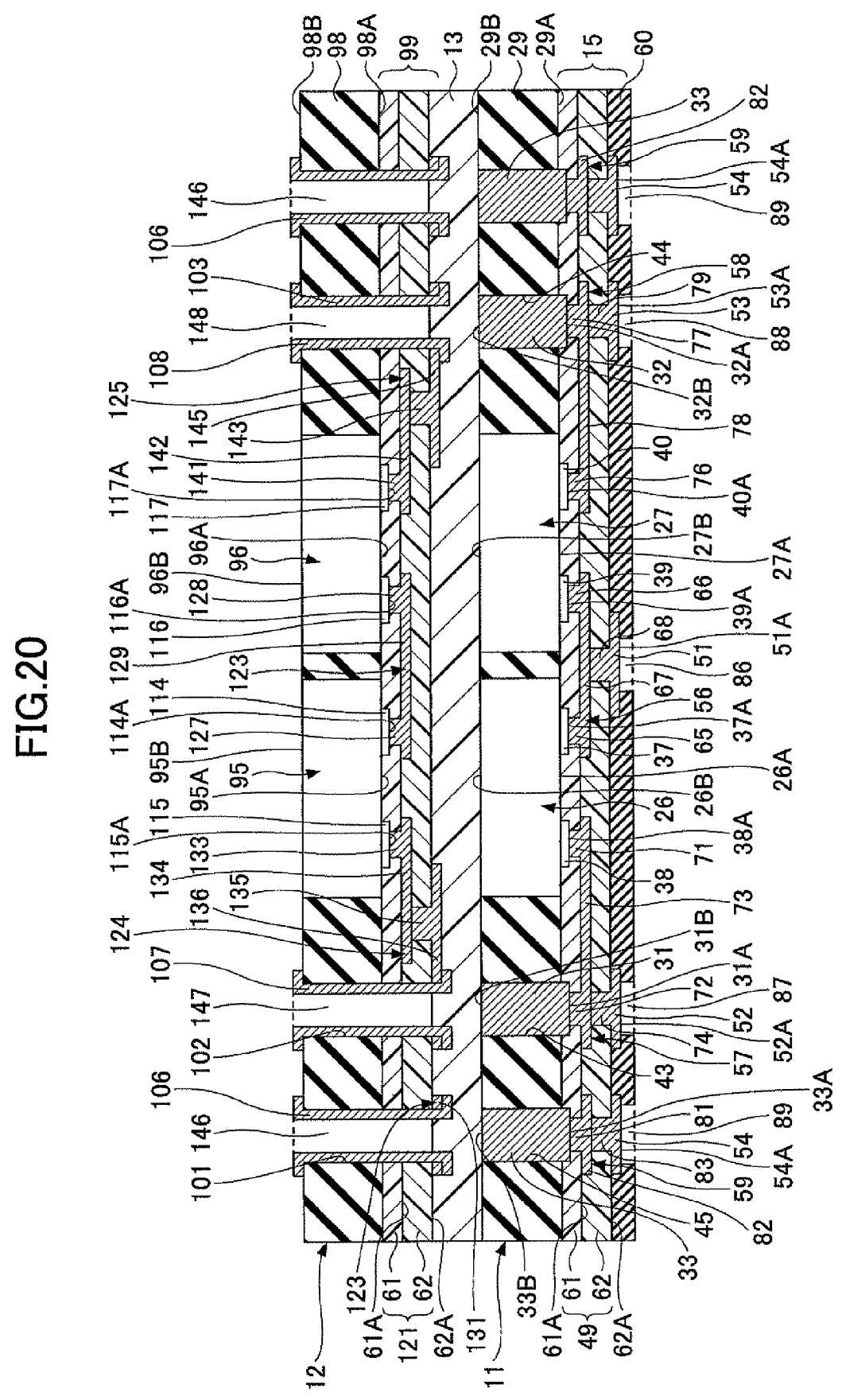

FIG. 20 is an explanatory view (part 18) for explaining the method of fabricating the electronic apparatus according to the first embodiment of the present invention;

DESCRIPTION OF THE PREFERRED EMBODIMENTS

First Embodiment

Figure 1:
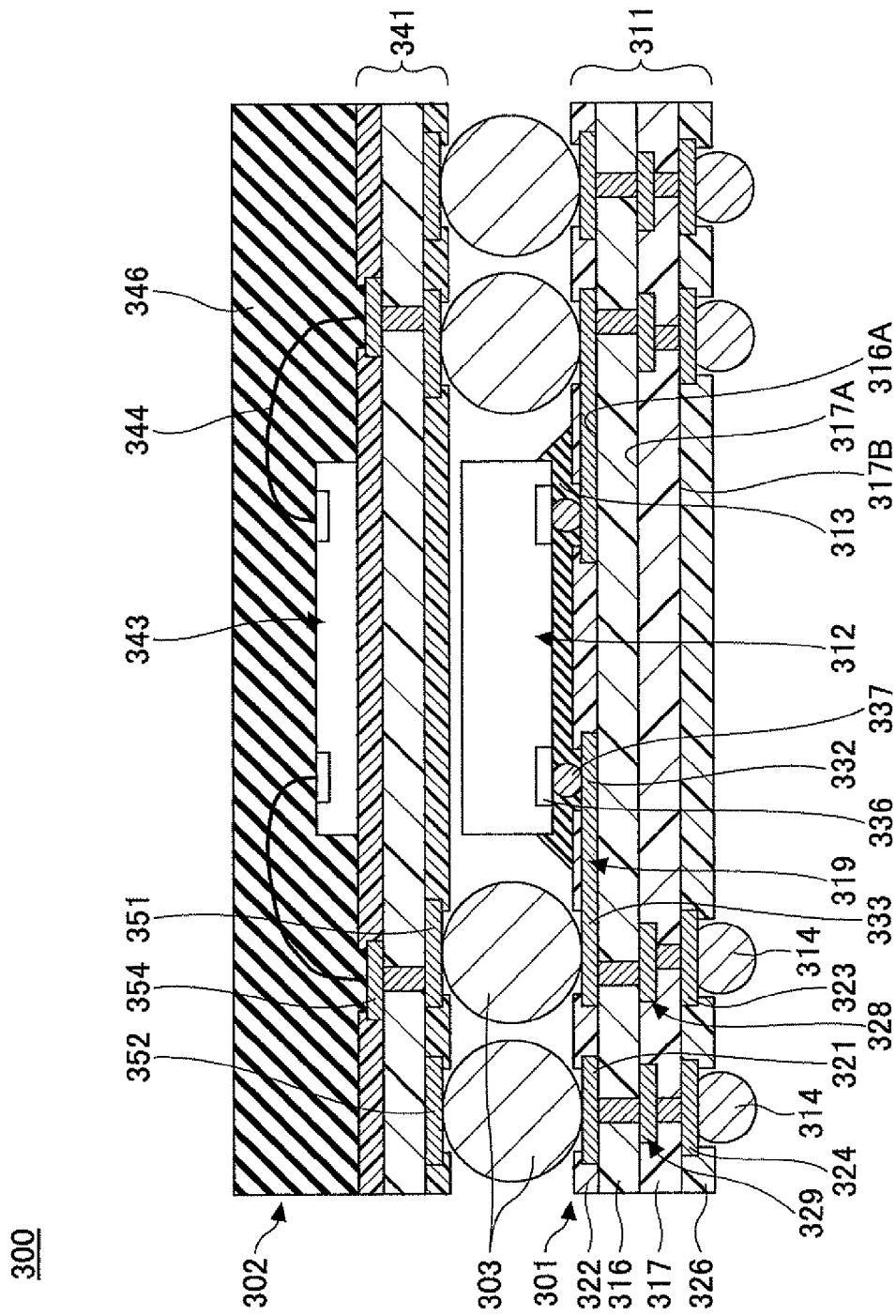
FIG. 1 is a cross-sectional view of a related art electronic apparatus.
Figure 2:
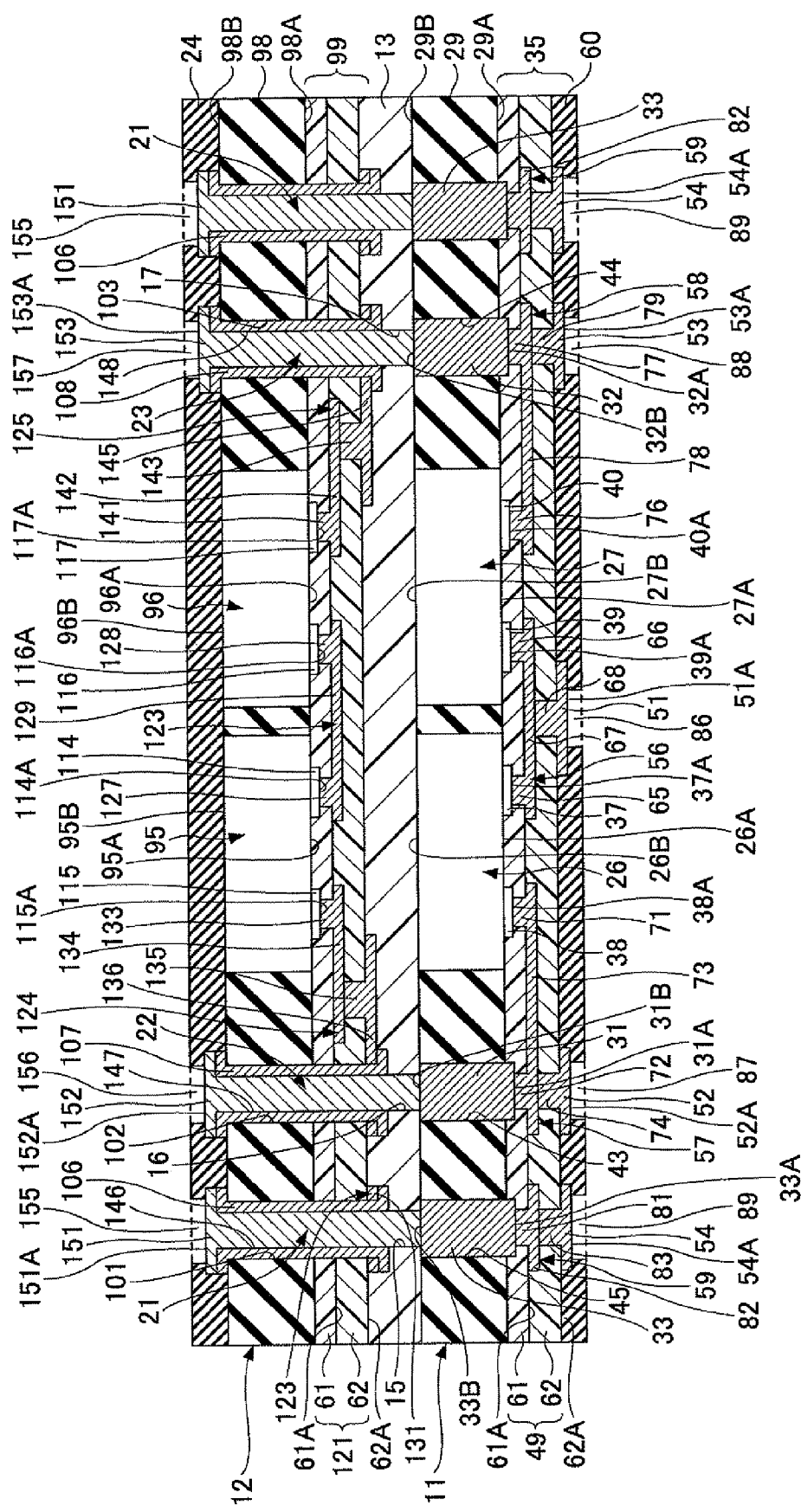
FIG. 2 is a cross-sectional view of an electronic apparatus according to a first embodiment of the present invention.

FIG. 2 is a cross-sectional view of an electronic apparatus according to a first embodiment of the present invention.

As shown, an electronic apparatus 10 according to the first embodiment includes a first semiconductor component 11, a second semiconductor component 12, an adhesion layer 13, through holes (third through holes) 15 through 17, through electrodes (third through electrodes) 21 through 23, and a solder resist layer 24.

The first semiconductor component 11 includes first electronic parts 26, 27, an insulation member 29, through electrodes (first through electrodes) 31 through 33, and a multilayer wiring structure (first multilayer wiring structure) 35. The first electronic part 26 is a thin-plate electronic part, and includes first electrode pads 37, 38 having connection surfaces 37A, 38A, a first electrode pad forming surface 26A on which the first electrode pads 37, 38 are formed, and a back surface (first back surface) 26B opposing the first electrode pad forming surface 26A.

The first electrode pads 37, 38 and the first electrode pad forming surface 26A are exposed through a multilayer wiring structure forming surface (first multilayer wiring structure forming surface) 29A of the insulation member 29 that seals the first electronic parts 26, 27. Specifically, the first electrode pads 37, 38 are protruded from the multilayer wiring structure forming surface 29A. The back surface 26B of the first electronic part 26 is exposed through a plane 29B, which is an opposing surface with respect to the multilayer wiring structure forming surface 29A, of the insulation member 29. A thickness of the first electronic part 26 may be about 200 μm.

The first electronic part 27 is a thin-plate electronic part, and includes first electrode pads 39, 40 having connection surfaces 39A, 40A, a first electrode pad forming surface 27A on which the first electrode pads 39, 40 are formed, and a back surface (first back surface) 27B opposing the first electrode pad forming surface 27A.

The first electrode pads 39, 40 and the first electrode pad forming surface 27A are exposed through the multilayer wiring structure forming surface 29A of the insulation member 29 that seals the first electronic parts 26, 27. Specifically, the first electrode pads 39, 40 are protruded from the multilayer wiring structure forming surface 29A. The back surface 27B of the first electronic part 27 is exposed through the plane 29B of the insulation member 29. A thickness of the first electronic part 27 is substantially the same as that of the first electronic part 26, and may be, for example, about 200 μm.

Semiconductor chips may be used as the first electronic parts 26, 27. Specifically, both of the first electronic parts 26, 27 may be semiconductor chips such as Central Processing Units (CPUs); one of the first electronic parts 26, 27 may be a semiconductor chip such as a CPU, while the other one of the first electronic parts 26, 27 may be a semiconductor chip such as a memory; or one of the first electronic parts 26, 27 may be a semiconductor chip such as a CPU, while the other one of the first electronic parts 26, 27 may be a semiconductor chip such as a Graphics Processing Unit (GPU).

The insulation member 29 is arranged around the first electronic parts 26, 27 in order to seal side surfaces of the first electronic parts 26, 27. The insulation member 29 has substantially the same thickness as the thicknesses of the first electronic parts 26, 27 and may be about 200 μm.

The insulation member 29 includes the multilayer wiring structure forming surface 29A, the plane 29B opposing the multilayer wiring structure forming surface 29A, and through holes 43 through 45. The multilayer wiring structure forming surface 29A and the first electrode pad forming surfaces 26A, 27A form substantially the same plane. The multilayer wiring structure 35 is formed on the multilayer wiring structure forming surface 29A.

The plane 29B of the insulation member 29, the back surface 26B of the first electronic part 26, and the back surface 27B of the first electronic part 27 form substantially the same plane. The through holes 43 through 45 are formed to go through the insulation member 29 in areas around the first electronic parts 26, 27. Diameters of the through holes 43 through 45 may be about 200 μm.

A mold resin, for example, an epoxy resin may be used as the insulation member 29 having the above configuration.

The through electrode 31 is formed in the through hole 43. A depth of the through hole 31 is greater than the thickness of the insulation member 29. The through electrode 31 includes a first connection surface 31A on the side of the multilayer wiring structure forming surface 29A, and a second connection surface 31B on the side of the plane 29B of the insulation member 29. The first connection surface 31A is exposed through and protruded from the multilayer wiring structure forming surface 29A. The first connection surface 31A forms substantially the same plane as the connection surfaces 37A, 38A, 39A, 40A of the corresponding electrode pads 37, 38, 39, 40. The second connection surface 31B is exposed through the plane 29B of the insulation member 29, and forms substantially the same plane as the plane 29B of the insulation member 29.

The through electrode 32 is formed in the through hole 44. A depth of the through electrode 32 is greater than the thickness of the insulation member 29. The through electrode 32 includes a first connection surface 32A on the side of the multilayer wiring structure forming surface 29A, and a second connection surface 32B on the side of the plane 29B of the insulation member 29. The first connection surface 32A is exposed through and protruded from the multilayer wiring structure forming surface 29A. The first connection surface 32A forms substantially the same plane as the connection surfaces 37A, 38A, 39A, 40A of the corresponding electrode pads 37, 38, 39, 40. The second connection surface 32B is exposed through the plane 29B of the insulation member 29, and forms substantially the same plane as the plane 29B of the insulation member 29.

The through electrode 33 is formed in the through hole 45. A depth of the through electrode 33 is greater than the thickness of the insulation member 29. The through electrode 33 includes a first connection surface 33A on the side of the multilayer wiring structure forming surface 29A, and a second connection surface 33B on the side of the plane 29B of the insulation member 29. The first connection surface 33A is exposed through and protruded from the multilayer wiring structure forming surface 29A. The first connection surface 33A forms substantially the same plane as the connection surfaces 37A, 38A, 39A, 40A of the corresponding electrode pads 37, 38, 39, 40. The second connection surface 33B is exposed through the plane 29B of the insulation member 29, and forms substantially the same plane as the plane 29B of the insulation member 29.

The through electrodes 31 through 33 may be made of, for example, copper.

As stated above, because the back surfaces 26B, 27B of the corresponding first electronic parts 26, 27, the plane 29B of the insulation member 29, and the connection surfaces of 31B, 32B, 33B of the corresponding through electrodes 31 through 33 are configured to form the same plane, a gap between the first semiconductor component 11 and the second semiconductor component 12 mounted above the first semiconductor component 11 can be reduced, thereby reducing a thickness of the electronic apparatus 10.

The multilayer wiring structure 35 includes a stacked body (first stacked body) 49, external connection pads 51 through 54, patterned wirings 56 through 59, and a solder resist layer 60.

The stacked body 49 includes plural insulation layers 61, 62 that are stacked one on the other. The insulation layer 61 is provided in order to cover the multilayer wiring structure forming surface 29A, the first electrode pad forming surfaces 26A, 27A, the first electrode pads 37 through 40, and protruding portions of the through electrodes 31 through 33. The insulation layer 61 may be made of an insulation resin (e.g., an epoxy resin). A thickness of the first insulation layer 61 may be about 5 through 30 μm.

The insulation layer 62 is formed on a surface 61A of the insulation layer 61. The insulation layer 62 may be made of an insulation resin (e.g., an epoxy resin). A thickness of the insulation layer 62 may be about 5 through 30 μm.

The external connection pads 51, 52, 53, are provided on a plane 62A of the insulation layer 62. The external connection pad 51 includes a connection surface 51A on which an external connection terminal (not shown) is arranged. The external connection pad 51 is connected to the patterned wiring 56 and further to the first electronic parts 26, 27 via the patterned wiring 56.

The external connection pad 52 includes a connection surface 52A on which an external connection terminal (not shown) is arranged. The external connection pad 52 is connected to the patterned wiring 57 and further to the first electronic part 26 and the second semiconductor component 12 via the patterned wiring 57.

The external connection pad 53 includes a connection surface 53A on which an external connection terminal (not shown) is arranged. The external connection pad 53 is connected to the patterned wiring 58 and further to the first electronic part 27 and the second semiconductor component 12 via the patterned wiring 58.

The external connection pad 54 includes a connection surface 54A on which an external connection terminal (not shown) is arranged. The external connection pad 54 is connected to the patterned wiring 59 and further to the second semiconductor component 12 via the patterned wiring 59.

The external connection pads 51, 52, 53, 54 may be made of, for example, copper.

The patterned wirings 56 through 59 are arranged inside and go through the stacked body 49. The patterned wiring 56 includes vias 65, 66, 68 and a wiring 67. The via 65 is provided to go through a portion of the insulation layer 61, the portion opposing the first electrode pad 37. One end portion of the via 65 is directly connected to the first electrode pad 37, which allows the via 65 to be electrically connected to the first electronic part 26.

The via 66 is provided to go through a portion of the insulation layer 61, the portion opposing the first electrode pad 39. One end portion of the via 66 is directly connected to the first electrode pad 39, which allows the via 66 to be electrically connected to the first electronic part 26.

The wiring 67 is provided on the plane 61A of the insulation layer 61. The wiring 67 is formed integrally with the other end portions of the vias 65, 66, which allows the wiring 67 to be electrically connected to the first electronic parts 26, 27.

The via 68 is provided to go through a portion of the insulation layer 62, the portion being positioned between the wiring 67 and the external connection pad 51. One end portion of the via 68 is connected to the wiring 67, and the other end portion of the via 68 is connected to the external connection pad 51, which allows the via 68 to be electrically connected to the wiring 67 and the external connection pad 51.

The patterned wiring 56 having the above configuration electrically connects the first electronic parts 26, 27 and the external connection pad 51. The patterned wiring 56 may be made of, for example, copper.

The patterned wiring 57 includes vias 71, 72, 74 and a wiring 73. The via 71 is provided to go through a portion of the insulation layer 61, the portion opposing the first electrode pad 38. One end portion of the via 71 is directly connected to the first electrode pad 38, which allows the first electronic part 26 to be electrically connected to the first electronic part 26.

The via 72 is provided to go through a portion of the insulation layer 61, the portion being positioned below the through electrode 31. One end portion of the via 72 is directly connected to the first connection surface 31A of the through electrode 31, which allows the via 72 to be electrically connected to the through electrode 31.

The wiring 73 is provided on the plane 61A of the insulation layer 61. The wiring 73 is formed integrally with one end portion of each of the vias 71, 72, which allows the wiring 73 to be electrically connected to the first electronic part 26 and the second semiconductor component 12 by way of the vias 71, 72.

The via 74 is provided to go through a portion of the insulation layer 62, the portion being positioned between the wiring 73 and the external connection pad 52. One end portion of the via 74 is connected to the wiring 73, and the other end portion of the via 74 is formed integrally with the external connection pad 52, which allows the via 74 to be electrically connected to the external connection pad 52.

The patterned wiring 57 having the above configuration electrically connects the first electronic part 26, the through electrode 31, and the external connection pad 52. The patterned wiring 57 may be made of, for example, copper.

The patterned wiring 58 includes vias 76, 77, 79 and a wiring 78. The via 76 is provided to go through a portion of the insulation layer 61, the portion opposing the first electrode pad 40. One end portion of the via 76 is directly connected to the first electrode pad 40, which allows the via 75 to be electrically connected to the first electronic part 27.

The via 77 is provided to go through a portion of the insulation layer 61, the portion being positioned below the through electrode 32. An upper end portion of the via 77 is directly connected to the first connection surface 32A of the through electrode 32, which allows the via 77 to be electrically connected to the through electrode 32.

The wiring 78 is provided on the plane 61A of the insulation layer 61. The wiring 78 is formed integrally with one end portion of each of the vias 76, 77, which allows the wiring to be electrically connected to the first electronic part 26 and the second semiconductor component 12 by way of the vias 76, 77.

The via 79 is provided to go through a portion of the insulation layer 62, the portion being positioned between the wiring 78 and the external connection pad 53. One end portion of the via 79 is connected to the wiring 78, and the other end portion of the via 79 is connected to the external connection pad 53, which allows the via 79 to be electrically connected to the wiring 78 and the external connection pad 53.

The patterned wiring 58 having the above configuration electrically connects the first electronic part 27, the through electrode 32, and the external connection pad 53. The patterned wiring 58 may be made of, for example, copper.

The patterned wiring 59 includes a via 81, a via 83, and a wiring 82. The via 81 is provided to go through a portion of the insulation layer 61, the portion opposing the through electrode 33. One end portion of the via 81 is directly connected to the first connection surface 33A of the through electrode 33, which allows the via 81 to be electrically connected to the through electrode 33.

The wiring 82 is provided on the plane 61A of the insulation layer 61. The wiring 82 is formed integrally with the other end portion of the via 81, which allows the wiring 82 to be electrically connected to the through electrode 33 by way of the via 81.

The via 83 is provided to go through a portion of the insulation layer 62, the portion being positioned between the wiring 82 and the external connection pad 54. One end portion of the via 83 is connected to the wiring 82, and the other end portion of the via 83 is connected to the external connection pad 54, which allows the via 83 to be electrically connected to the wiring 82 and the external connection pad 54.

The patterned wiring 59 having the above configuration electrically connects the through electrode 33 and the external connection pad 54. The patterned wiring 59 may be made of, for example, copper.

As stated above, the patterned wiring 57 of the multilayer wiring structure 35 and the first electrode pad 38 of the first electronic part 26 are directly connected with each other; the patterned wiring 56 of the first electronic part 26, the first electrode pad 37 of the first electronic part 26, and the first electrode pad 39 of the first electronic part 27 are directly connected with one another; and the patterned wiring 58 of the multilayer wiring structure 35 and the first electrode pad 40 are directly connected with each other. Therefore, a thickness of the first semiconductor component 11 can be reduced when being compared with the related art semiconductor component 301 where the first electronic part 312 and the patterned wiring 319 are electrically connected with each other via the bumps 337 or metal wirings.

The solder resist layer 60 is provided on the plane 62A of the insulation layer 62. The solder resist layer 60 includes openings 86, 87, 88, 89 that allow the corresponding connection surfaces 51A, 52A, 53A, 54A to be exposed.

A thickness of the multilayer wiring structure 35 having the above configuration is less than the thicknesses of the first electronic parts 26, 27 and the insulation member 29 that are shown in FIG. 2. The thickness of the multilayer wiring structure may be about 20 through about 80 μm. The multilayer wiring structure 35 is configured as a film-like body or a layered body.

The second semiconductor component 12 includes second electronic parts 95, 96, an insulation member (second insulation member) 98, a multilayer wiring structure (second multilayer wiring structure) 99, through holes (first through holes) 101 through 103, and through electrodes (second electrodes) 106 through 108.

The second electronic part 95 is a thin-plate electronic part, and includes second electrode pads 114, 115 having connection surfaces 114A, 115A, a second electrode pad forming surface 95A on which the second electrode pads 114, 115 are formed, and a back surface (second back surface) 95B opposing the second electrode pad forming surface 26A.

The second electrode pads 114, 115 and the second electrode pad forming surface 95A are exposed through a multilayer wiring structure forming surface (second multilayer wiring structure forming surface) 98A of an insulation member 98 that seals the second electronic parts 95, 96. Specifically, the second electrode pads 114, 115 are protruded from the multilayer wiring structure forming surface 98A. The back surface 95B of the second electronic part 95 is exposed through a plane 98B, which is an opposing surface with respect to the multilayer wiring structure forming surface 98A, of the insulation member 98. A thickness of the first electronic part 95 may be about 200 μm.

The second electronic part 96 is a thin-plate electronic part, and includes second electrode pads 116, 117 having connection surfaces 116A, 117A, a second electrode pad forming surface 96A on which the second electrode pads 116, 117 are formed, and a back surface (second back surface) 96B opposing the second electrode pad forming surface 96A.

The second electrode pads 116, 117 and the second electrode pad forming surface 96A are exposed through the multilayer wiring structure forming surface 98A of the insulation member 98 that seals the second electronic parts 95, 96. Specifically, the second electrode pads 116, 117 are protruded from the multilayer wiring structure forming surface 98A. The back surface 96B of the second electronic part 96 is exposed through the plane 98B of the insulation member 98. A thickness of the second electronic part is substantially the same as that of the second electronic part 95, and may be about 200 μm.

Semiconductor chips may be used as the second electronic parts 95, 96. Specifically, both of the second electronic parts 95, 96 may be semiconductor chips such as Central Processing Units (CPUs); one of the second electronic parts 95, 96 may be a semiconductor chip such as a CPU, while the other one of the second electronic parts 95, 96 may be a semiconductor chip such as a memory; or one of the second electronic parts 95, 96 may be a semiconductor chip such as a CPU, while the other one of the second electronic parts 95, 96 may be a semiconductor chip such as a Graphics Processing Unit (GPU).

The insulation member 98 is arranged around the second electronic parts 95, 96 in order to seal side surfaces of the second electronic parts 95, 96. The insulation member 98 has substantially the same thickness as each of the second electronic parts 95, 96 and may be about 200 μm.

The insulation member 98 includes the multilayer wiring structure forming surface 98A, and the plane 98B opposing the multilayer wiring structure forming surface 98A. The multilayer wiring structure forming surface 98A and the second electrode pad forming surfaces 95A, 96A form substantially the same plane. The multilayer wiring structure 99 is formed on the multilayer wiring structure forming surface 98A.

The plane 98B of the insulation member 98 forms substantially the same plane along with the back surfaces 95B, 96B of the second electronic parts 95, 96.

A mold resin, for example, an epoxy resin may be used as the insulation member 29 having the above configuration.

The multilayer wiring structure 99 includes a stacked body (second stacked body) 121 and patterned wirings 123 through 125. The stacked body 121 includes plural insulation layers 61, 62 that are stacked one on the other. The stacked body 121 has substantially the same configuration as the stacked body 49 previously explained, except that the insulation layer 61 is provided to cover the multilayer wiring structure forming surface 98A, the second electrode pad forming surfaces 95A, 96A, and the second electrode pads 114 through 117.

The patterned wirings 123 through 125 are arranged inside and go through the stacked body 121. The patterned wiring 123 includes vias 127, 128 and a wiring 129. The via 127 is provided to go through a portion of the insulation layer 61, the portion opposing the second electrode pad 114. One end portion of the via 127 is directly connected to the second electrode pad 114, which allows the via 127 to be electrically connected to the second electronic part 95.

The via 128 is provided to go through a portion of the insulation layer 61, the portion opposing the second electrode pad 116. One end portion of the via 128 is directly connected to the second electrode pad 116, which allows the via 128 to be electrically connected to the second electronic part 96.

The wiring 129 is provided on the plane 61A of the insulation layer 61. The wiring 129 is formed integrally with the other end portions of the vias 127, 128, which allows the wiring 129 to be electrically connected to the second electronic parts 95, 96 by way of the vias 127, 128.

The wiring 131 is provided on the plane 62A of the insulation layer 61. The wiring 131 is electrically connected to the wiring 129 via a via (not shown) that goes through the insulation layer 62.

The patterned wiring 123 having the above configuration is electrically connected to the second electronic parts 95, 96. The patterned wiring 123 may be made of, for example, copper.

The patterned wiring 124 includes vias 133, 135 and wirings 134, 136. The via 133 is provided to go through a portion of the insulation layer 61, the portion opposing the second electrode pad 115. One end portion of the via 133 is directly connected to the second electrode pad 115, which allows the via 133 to be electrically connected to the second electronic part 95.

The wiring 134 is provided on the plane 61A of the insulation layer 61. The wiring 134 is formed integrally with the other end portion of the via 133, which allows the wiring 134 to be electrically connected to the second electronic part 95 by way of the via 133.

The via 135 is provided to go through a portion of the insulation layer 62, the portion being positioned between the wiring 134 and the wiring 136. One end portion of the via 135 is connected to the wiring 134, and the other end portion of the via 135 is formed integrally with the wiring 136. With this, the via 135 electrically connects the wiring 134 and the wiring 135.

The wiring 136 is provided on the plane 62A of the insulation layer 62. The wiring 136 is formed integrally with the other end portion of the via 135, which allows the wiring 136 to be electrically connected to the wiring 134 by way of the via 135.

The patterned wiring 124 having the above configuration is electrically connected to the second electronic part 95. The patterned wiring 124 may be made of, for example, copper.

The patterned wiring 125 includes vies 141, 143 and wirings 142, 145. The via 141 is provided to go through a portion of the insulation layer 61, the portion opposing the second electrode pad 117. One end portion of the via 141 is directly connected to the second electrode pad 117, which allows the via 141 to be electrically connected to the second electronic part 95.

The wiring 142 is provided on the plane 61A of the insulation layer 61. The wiring 142 is formed integrally with the other end portion of the via 141, which allows the wiring 142 to be electrically connected to the second electronic part 96 by way of the via 141.

The via 143 is provided to go through a portion of the insulation layer 62, the portion being positioned between the wiring 142 and the wiring 145. One end portion of the via 143 is connected to the wiring 142, and the other end portion of the via 143 is formed integrally with the wiring 145. With this, the via 143 electrically connects the wiring 142 and the wiring 145.

The wiring 145 is provided on the plane 62A of the insulation layer 62. The wiring 145 is formed integrally with the via 143, which allows the wiring 145 to be electrically connected to the wiring 142 by way of the via 143.

The patterned wiring 125 having the above configuration is electrically connected to the second electronic part 96. The patterned wiring 125 may be made of, for example, copper.

As stated above, the second patterned wiring 123 of the multilayer wiring structure 99 and the second electrode pad 116 of the second electronic part 96 are directly connected to each other; the second patterned wiring 125 of the multilayer wiring structure 99 and the second electrode pad 117 of the second electronic part 96 are directly connected to each other; and the second patterned wiring 124 of the multilayer wiring structure 99 and the second electrode pad 115 of the second electronic part 95 are directly connected to each other. Therefore, a thickness of the second semiconductor component 12 can be reduced when being compared with a case where the second electronic parts 95, 96 are electrically connected to the corresponding patterned wirings 123 through 125 via the bumps or metal wirings.

The through hole 101 is formed to go through the insulation member 98, the stacked body 121, and the wiring 131. The through hole 101 allows an inner surface of the wiring 131 to be exposed. The through hole 101 is formed so that the second connection surface 33B of the through electrode 33 provided in the first semiconductor component 11 is exposed when the second semiconductor component 12 is arranged above the first semiconductor component 11.

The through hole 102 is formed to go through the insulation member 98, the stacked body 121, and the wiring 136. The through hole 102 allows an inner surface of the wiring 136 to be exposed. The through hole 102 is formed so that the second connection surface 31B of the through electrode 31 provided in the first semiconductor component 11 is exposed when the second semiconductor component 12 is arranged above the first semiconductor component 11.

The through hole 103 is formed to go through the insulation member 98, the stacked body 121, and the wiring 145. The through hole 103 allows an inner surface of the wiring 145 to be exposed. The through hole 103 is formed so that the second connection surface 32B of the through electrode 32 provided in the first semiconductor component 11 is exposed when the second semiconductor component 12 is arranged above the first semiconductor component 11. Diameters of the through holes 101 through 103 may be about 100 μm.

The through electrode 106 is provided on a part of the plane 98B of the insulation member 98, an inner surface of the through hole 101, a side surface and a lower surface of the wiring 131. With this, the through electrode 106 is electrically connected to the patterned wiring 123 and to the second electronic parts 95, 96 via the patterned wiring 123. The through electrode 106 has in the center a through hole (second through hole) 146 having a smaller diameter than that of the through hole 101. A diameter of the through hole 146 may be, for example, about 80 μm. The through electrode 106 may be made of, for example, copper.

The through electrode 107 is provided on a part of the plane 98B of the insulation member 98, an inner surface of the through hole 102, a side surface and a lower surface of the wiring 136. With this, the through electrode 107 is electrically connected to the patterned wiring 124 and to the second electronic part 95 via the patterned wiring 124. The through electrode 107 has in the center a through hole (second through hole) 147 having a smaller diameter than that of the through hole 102. A diameter of the through hole 147 may be, for example, about 80 μm. The through electrode 107 may be made of, for example, copper.

The through electrode 108 is provided on a part of the plane 98B of the insulation member 98, an inner surface of the through hole 103, a side surface and a lower surface of the wiring 145. With this, the through electrode 108 is electrically connected to the patterned wiring 125 and to the second electronic part 96 via the patterned wiring 125. The through electrode 108 has in the center a through hole (second through hole) 148 having a smaller diameter than that of the through hole 103. A diameter of the through hole 147 may be, for example, about 80 μm. The through electrode 108 may be made of, for example, copper.

A thickness of the multilayer wiring structure 99 having the above configuration is less than the thicknesses of the second electronic parts 95, 96 and the insulation member 98. A thickness of the multilayer wiring structure 99 may be, for example, about 20 through about 80 μm. The multilayer wiring structure 99 is configured as a film-like body or a layered body.

The adhesion layer 13 is arranged between the first semiconductor component 11 and the second semiconductor component 12. The adhesion layer 13 attaches a surface of the first semiconductor component 11, the surface being on the side of the back surfaces 26B, 27B of the first electronic parts 26, 27, and a surface of the second semiconductor component 12, the surface being on the side of the wirings 131, 136, 145.

With the adhesion layer 13, the back surfaces 26B, 27B of the first electronic parts 26, 27 constituting the first semiconductor component 11, the plane 19B of the insulation member 29, and the connection surfaces 31B, 32B, 33B of the through electrodes 31 through 33 are covered with the adhesion layer 13.

In addition, the plane 62A of the insulation layer 62 constituting the second semiconductor component 12, the wirings 131, 136, 145, and the protruding portions of the through electrodes 106 through 108 from the plane 62A of the insulation layer 62 are covered with the adhesion layer 13.

The adhesion layer 13 may be made of, for example, an insulation resin having adhesiveness (e.g., epoxy resin). A thickness of the adhesion layer 13 may be about 50 μm.

The through hole 15 is formed to go through a portion of the adhesion layer 13, the portion being positioned between the through hole 146 of the second semiconductor component 12 and the second connection surface 33S of the through electrode 33 of the first semiconductor component 11. The through hole 15 allows the second connection surface 33B of the through electrode 33 to be exposed, and is formed integrally with the through hole 146. A diameter of the through hole 15 is substantially the same as an inner diameter of the through hole 146, and may be, for example, about 80 μm.

The through hole 16 is formed to go through a portion of the adhesion layer 13, the portion being positioned between the through hole 147 of the second semiconductor component 12 and the second connection surface 31B of the through electrode 31 of the first semiconductor component 11. The through hole 16 allows the second connection surface 31B of the through electrode 31 to be exposed, and is formed integrally with the through hole 147. A diameter of the through hole 16 is substantially the same as an inner diameter of the through hole 147, and may be, for example, about 80 μm.

The through hole 17 is formed to go through a portion of the adhesion layer 13, the portion being positioned between the through hole 148 of the second semiconductor component 12 and the second connection surface 32B of the through electrode 32 of the first semiconductor component 11. The through hole 17 allows the second connection surface 32B of the through electrode 32 to be exposed, and is formed integrally with the through hole 148. A diameter of the through hole 17 is substantially the same as an inner diameter of the through hole 148, and may be, for example, about 80 μm.

The through electrode 21 fills the through holes 15, 146 and includes an external connection pad portion 151 provided in a protruding portion of the through electrode 106 from the plane 98B of the insulation member 98. The through electrode 21 is connected to the second connection surface 33B of the through electrode 33 and the through electrode 106. With this, the through electrode 21 electrically connects the first semiconductor component 11 and the second semiconductor component 12.

The external connection pad portion 151 serves as an external connection pad for the electronic apparatus 10. The external connection pad portion 151 includes a connection surface 151A to which an external connection terminal (not shown), for example, a solder ball is connected. The external connection pad portion 151 is wider than the diameter of the through hole 146, which makes it possible to certainly connect the external connection terminal (not shown) to the connection surface 151A.

The through electrode 21 having the above configuration may be made of, for example, copper.

The through electrode 22 fills the through holes 16, 147 and includes an external connection pad portion 152 provided in a protruding portion of the through electrode 107 from the plane 98B of the insulation member 98. The through electrode 22 is connected to the second connection surface 31B of the through electrode 31 and the through electrode 107. With this, the through electrode 22 electrically connects the first semiconductor component 11 and the second semiconductor component 12.

The external connection pad portion 152 serves as an external connection pad for the electronic apparatus 10. The external connection pad portion 152 includes a connection surface 152A to which an external connection terminal (not shown), for example, a solder ball is connected. The external connection pad portion 152 is wider than the diameter of the through hole 147, which makes it possible to certainly connect the external connection terminal (not shown) to the connection surface 152A.

The through electrode 22 having the above configuration may be made of, for example, copper.

The through electrode 23 fills the through holes 17, 148 and includes an external connection pad portion 153 provided in a protruding portion of the through electrode 108 from the plane 98B of the insulation member 98. The through electrode 23 is connected to the second connection surface 32B of the through electrode 32 and the through electrode 108. With this, the through electrode 23 electrically connects the first semiconductor component 11 and the second semiconductor component 12.

The external connection pad portion 153 serves as an external connection pad for the electronic apparatus 10. The external connection pad portion 153 includes a connection surface 153A to which an external connection terminal (not shown), for example, a solder ball is connected. The external connection pad portion 153 is wider than the diameter of the through hole 148, which makes it possible to certainly connect the external connection terminal (not shown) to the connection surface 153A.

The through electrode 22 having the above configuration may be made of, for example, copper.

As stated above, the second semiconductor component 12 is attached on the first semiconductor component 11 by the adhesion layer 13; the through holes 15 through 17 are formed to go through portions of the adhesion layer 13, the portions being positioned between the through holes 146 through 148 of the second semiconductor component 12 and the corresponding second connection surfaces 31B, 32B, 33B of the corresponding through electrodes 31, 32, 33 of the first semiconductor component 11; and the through holes 15 through 17 and 146 through 148 are filled with the corresponding through electrodes 21 through 23. Therefore, it is possible to electrically connect the first semiconductor component 11 and the second semiconductor component 12, without using an inner connection terminal (not shown), for example, a solder ball, thereby reducing a thickness of the electronic apparatus 10.

In addition, because the first semiconductor component 11 and the second semiconductor component 12 are electrically connected with each other via the through electrodes 21 through 23, reliability of electrical connection between the first semiconductor component 11 and the second semiconductor component 12 can be improved when being compared with a case where the first semiconductor component 11 and the second semiconductor component are connected with each other via the internal connection terminal, for example, a solder ball.

The solder resist layer 24 is provided on the back surfaces 95B, 96B of the corresponding second electronic parts 95, 96 and the plane 98B of the insulation member 98. The solder resist layer 24 includes openings 155 through 157. The opening 155 is formed so that the connection surface 151A of the external connection pad portion 151 provided in the through electrode 21 is exposed. The opening 156 is formed so that the connection surface 152A of the external connection pad portion 152 provided in the through electrode 22 is exposed. The opening 157 is formed so that the connection surface 153A of the external connection pad portion 153 provided in the through electrode 23 is exposed.

According to the electronic apparatus 10 of an embodiment of the present invention, the second semiconductor component 12 is attached on the first semiconductor component 11 by the adhesion layer 13; the through holes 15 through 17 are formed to go through portions of the adhesion layer 13, the portions being positioned between the through holes 146 through 148 of the second semiconductor component 12 and the corresponding second connection surfaces 31B, 32B, 33B of the corresponding through electrodes 31, 32, 33 of the first semiconductor component 11; and the through holes 15 through 17 and 146 through 148 are filled with the corresponding through electrodes 21 through 23 that connect the second surfaces 31B, 32B, 33B and the corresponding through electrodes 106 through 108. Therefore, it is possible to electrically connect the first semiconductor component 11 and the second semiconductor component 12, without using an inner connection terminal (not shown), for example, a solder ball, thereby reducing a thickness of the electronic apparatus 10.

In addition, because the first semiconductor component 11 and the second semiconductor component 12 are electrically connected via the through electrodes 21 through 23, reliability of electrical connection between the first semiconductor component 11 and the second semiconductor component 12 can be improved when being compared with a case where the first semiconductor component 11 and the second semiconductor component 12 are connected with each other via the internal connection terminal, for example, a solder ball.

FIGS. 3 through 23 illustrate steps of a fabrication method of the electronic apparatus according to the first embodiment of the present invention. In these drawings, the same or corresponding reference symbols are given to the same or corresponding components or parts as those of the electronic apparatus 10 according to the first embodiment.

Referring to FIGS. 3 through 23, the fabrication method of the electronic apparatus 10 of the first embodiment is explained. First, after an adhesive 162 is applied onto an upper surface 161A of a supporting body 161, the first electronic parts 26, are attached on the upper surface 161A by the adhesive 162 in a step illustrated in FIG. 3.

At this time, the first electronic parts 26, 27 are attached on the upper surface 161A of the supporting body 161 so that the connection surfaces 37A, 38A, 39A, 40A of the corresponding electrode pads 37, 38, 39, 40 come into contact with the upper surface 161A of the supporting body 161. Preferably, the first electronic parts 26, 27 are partly buried into the adhesive 162 by pressing the first electronic parts 26, 27 toward the upper surface 161A, in order to force the connection surfaces 37A, 38A, 39A, 40A of the corresponding electrode pads 37, 38, 39, 40 into contact with the upper surface 161A of the supporting body 161.

The first electronic parts 26, 27 are not thinned at this stage. Because the first electronic parts 26, 27 are handled more easily before being thinned than after being thinned, the first electronic parts 26, 27 can be fixed in predetermined positions with higher accuracy. Thicknesses of the first electronic parts 26, 27 before being thinned may be, for example, about 700 µm.

Semiconductor chips may be used as the first electronic parts 26, 27. Specifically, both of the first electronic parts 26, 27 may be semiconductor chips such as Central Processing Units (CPUs); one of the first electronic parts 26, 27 may be a semiconductor chip such as a CPU, while the other one of the first electronic parts 26, 27 may be a semiconductor chip such as a memory; or one of the first electronic parts 26, 27 may be a semiconductor chip such as a CPU, while the other one of the first electronic parts 26, 27 may be a semiconductor chip such as a Graphics Processing Unit (GPU).

The supporting body 161 may be, for example, a glass substrate, a silicon substrate, a metal plate (e.g., a copper plate), or the like. A thickness of the supporting body 161 may be, for example, about 300 through about 600 µm. The adhesive 162 may be, for example, an adhesive polyimide resin tape having a thickness of about 1 through about 20 µm.

Figure 4:
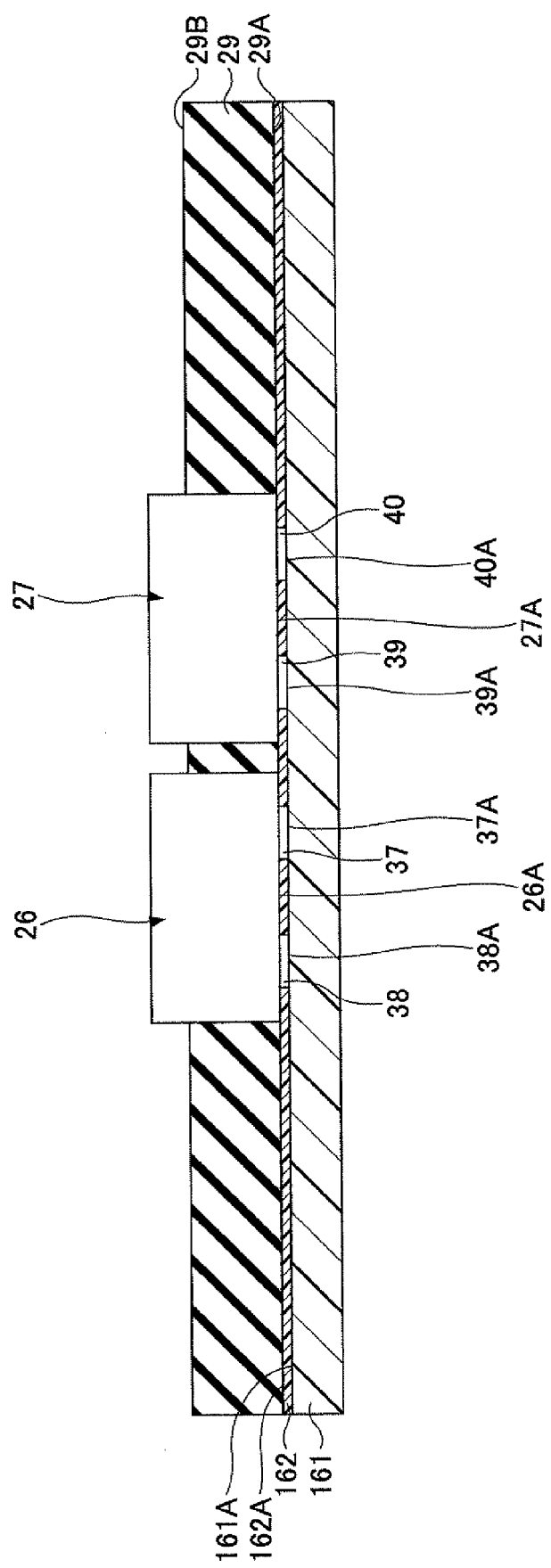
FIG. 4 is an explanatory view (part 2) for explaining the method of fabricating the electronic apparatus according to the first embodiment of the present invention.

Next, the insulation member 29 that seals a part of a side surface of the first electronic parts 26, 27 is formed on an upper surface 162A of the adhesive 162 in a step illustrated in FIG. 4.

The insulation member 29 may be, for example, a mold resin (e.g., an epoxy-based mold resin). The insulation member 29 may be formed by, for example, a transfer mold method. A thickness of the insulation member 29 may be, for example, about 300 µm at this stage.

Figure 5:
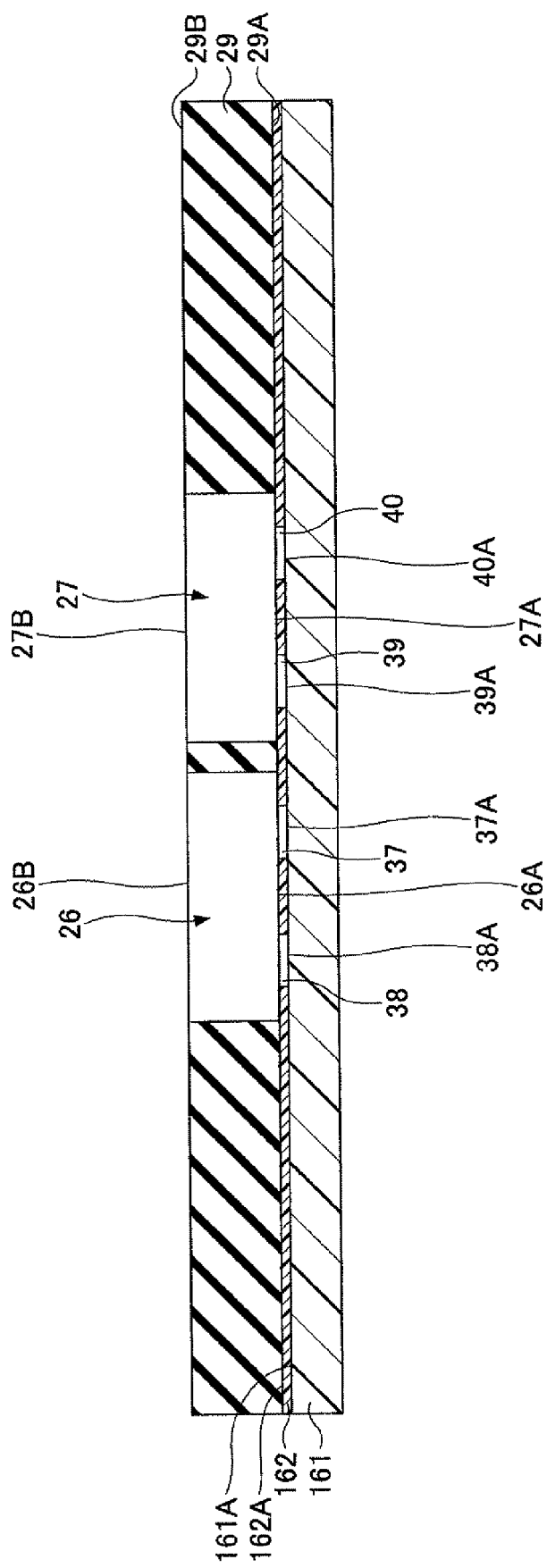
FIG. 5 is an explanatory view (part 3) for explaining the method of fabricating the electronic apparatus according to the first embodiment of the present invention.

Next, the first electronic parts 26, 27 and the insulation member 29 are ground, for example, using a back side grinder from the upper surface of the structure illustrated in FIG. 4 (the back surfaces 26B, 27B of the first electronic parts 26, 27), in a step illustrated in FIG. 5. As a result, the first electronic parts 26, 27 are thinned, and the back surfaces 26B, 27B of the first electronic parts 26, 27 that have been thinned and the plane 29B of the insulation member 29 form the same plane, which makes flat an upper surface of the structure illustrated in FIG. 5.

Thicknesses of the first electronic parts 26, 27 that have been thinned may be, for example, about 200 μm. Note that these thicknesses do not correspond to a height of the back surfaces 26B, 27B measured from the upper surface 161A of the supporting body 161. Incidentally, a thickness of the insulation member 29 may also be, for example, about 200 μm after having been thinned.

Figure 6:
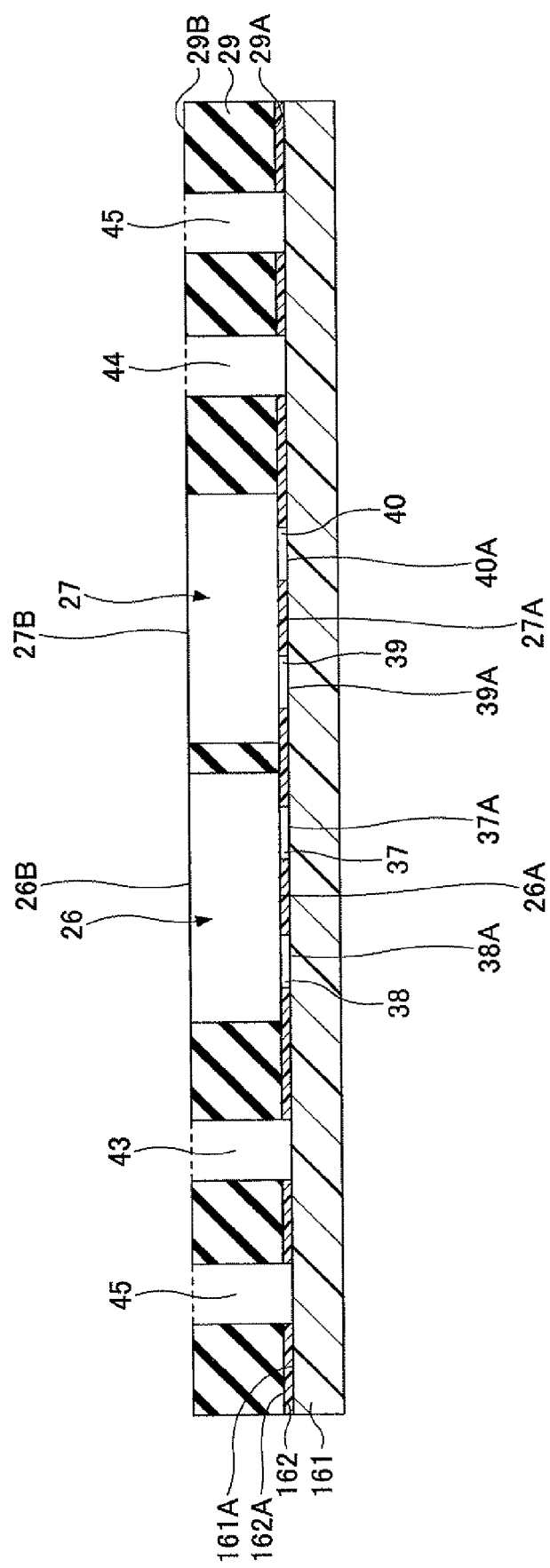
FIG. 6 is an explanatory view (part 4) for explaining the method of fabricating the electronic apparatus according to the first embodiment of the present invention.

Next, the through holes 43 through 45 that go through the insulation layer 162 and the adhesive 162 are formed from the plane 29B of the insulation member 29, in a step illustrated in FIG. 6.

The through holes 43 through 45 may be formed by irradiating a laser beam onto portions of the insulation member 29 where the through holes 43 through 45 are to be formed and the adhesive 162. The through holes 43 through 45 are formed so that the upper surface 161A of the supporting body 161 is exposed. Diameters of the through holes 43 through 45 may be, for example, about 200 μm.

Figure 7:
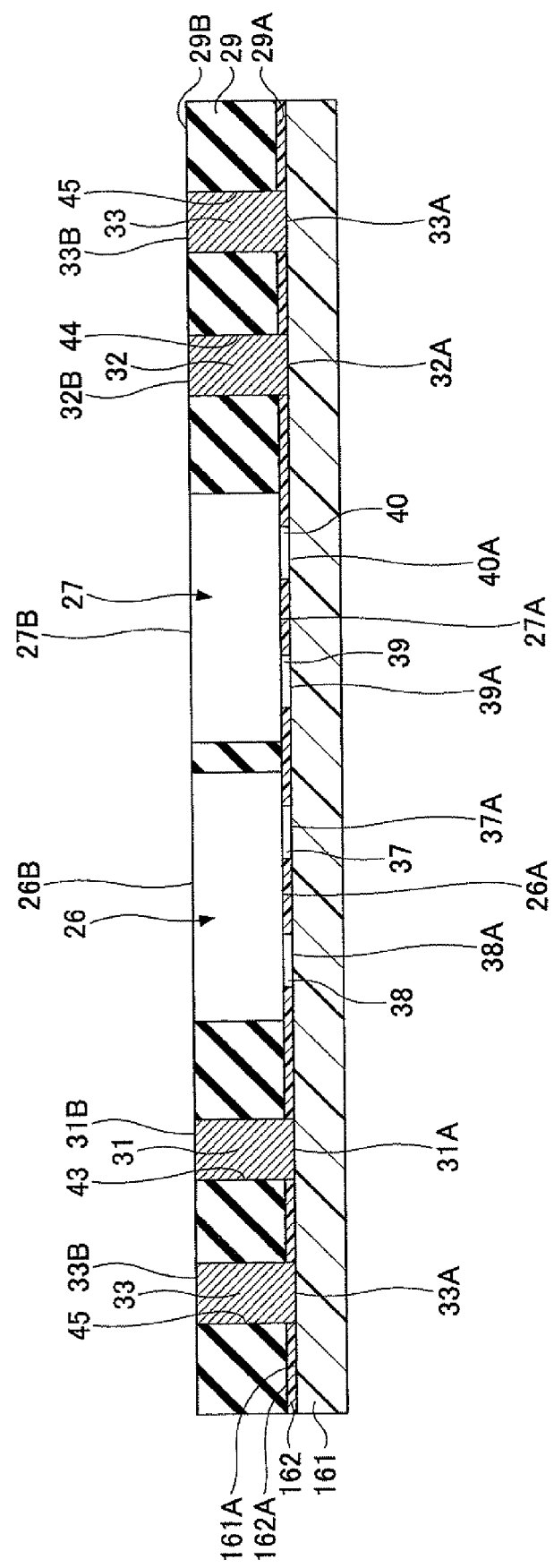
FIG. 7 is an explanatory view (part 5) for explaining the method of fabricating the electronic apparatus according to the first embodiment of the present invention.

Next, the through hole 43 is filled with the through electrode 31 having the first and the second connection surfaces 31A, 31B; the through hole 44 is filled with the through electrode 32 having the first and the second connection surfaces 32A, 32B; and the through hole 45 is filled with the through electrode 33 having the first and the second connection surfaces 33A, 33B, in a step illustrated in FIG. 7.

At this time, the through electrodes 31 through 33 are formed so that the second connection surfaces 31B, 32B, 33B of the through electrodes 31 through 33, the back surfaces 26B, 27B of the first electronic parts 26, 27, and the plane 29B of the insulation member 29 form the same plane. The through electrodes 31 through 33 may be formed by, for example, an electroplating method, a printing method, or the like.

When the electroplating method is used to form the through electrodes 31 through 33, a copper layer is formed on the upper surface 161A of the supporting body (e.g., a silicon substrate, a glass substrate, or the like) 161 by a supporting method in advance, and then the steps illustrated in FIGS. 3 through 6 are carried out. Next, the electroplating method is executed by feeding electricity to the copper layer serving as a power feeding layer, thereby to fill the through holes 43 through 45 with, for example, copper.

Incidentally, when the support body 161 is made of a metal (e.g., copper) plate, the need for the copper layer is eliminated because the metal plate can serve as the power feeding layer.

In addition, after the through electrodes 31 through 33 are formed, a protection layer may be provided on the second connection surfaces 31B, 32B, 33B of the corresponding through electrodes 31 through 33. The protection layer may be formed of, for example, a nickel (Ni)/gold (Au) stacked layer, specifically a nickel (Ni) layer electroplated on the second connection surfaces 31B, 32B, 33B and an Au layer electroplated on the Ni layer.

Figure 8:
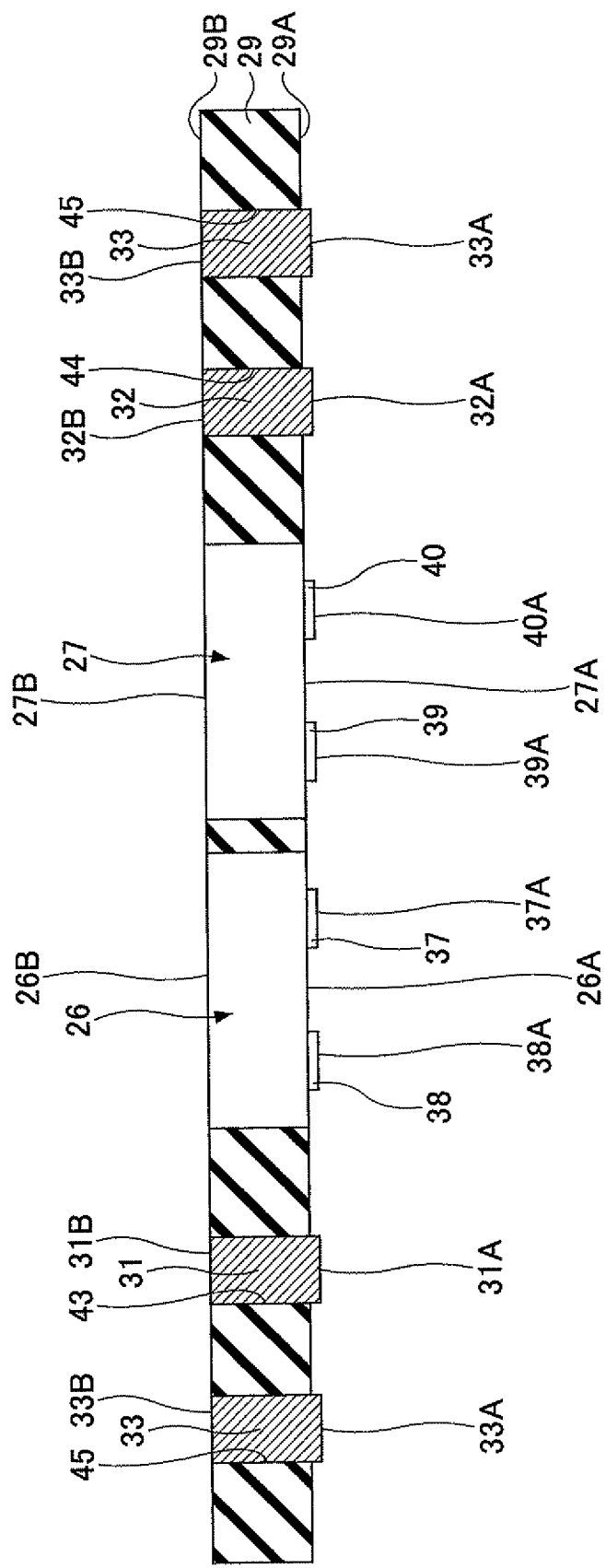
FIG. 8 is an explanatory view (part 6) for explaining the method of fabricating the electronic apparatus according to the first embodiment of the present invention.

Next, the supporting body 161 and the adhesive 162 are removed from the insulation member 29 having the first electronic parts 26, 27 and the through electrodes 31 through 33, in a step illustrated in FIG. 8.

Specifically, the supporting body 161 is mechanically removed along with the adhesive 162 from the insulation member 29 having the first electronic parts 26, 27 and the through electrodes 31 through 33.

With this, the through electrodes 31 through 33 and the first electrode pads 37 through 40 are protruded from the multilayer wiring structure forming surface 29A of the insulation member 29 by a thickness of the adhesive 162. Such protrusions cause substantially no problems in fabricating the electronic apparatus.

In addition, the first connection surfaces 31A, 32A, 33A of the corresponding through electrodes 31, 32, 33, the connection surfaces 37A, 38A, 39A, 40A of the corresponding first electrode pads 37, 38, 39, 40, and the multilayer wiring structure forming surface 29A do not form the same plane.

Next, the insulation layer 61 having the openings 163 through 169 is formed on the multilayer wiring structure forming surface 29A, the first electrode pads 37 through 40, the first electrode pad forming surfaces 26A, 27A, and the first connection surfaces 31A, 32A, 33A of the corresponding through electrodes 31, 32, 33.

Specifically, the insulation layer 61 is formed by attaching an insulation resin film (e.g., an epoxy resin film) serving as a mother material of the insulation layer 61 on a lower surface of a structure illustrated in FIG. 8, and laser-machining portions of the insulation resin film where the openings 163 through 169 are provided.

The openings 163 through 166 are formed so that the corresponding connection surfaces 37A through 40A are exposed. The opening 164 is formed so that the connection surface 38A is exposed. The openings 167, 168, 169 are formed so that the connection surfaces 31A, 32A, 33A of the through electrodes 31, 32, 33, respectively are exposed.

Next, the vias 65, 66, 71, 72, 76, 77, 81 are formed in the corresponding openings 163, 165, 164, 167, 166, 168, 169, respectively and simultaneously the wirings 67, 73, 78, 82 are formed on the plane 61A of the insulation layer 61. With this, the first electrode pads 37, 38 of the first electronic part 26 are directly connected with the corresponding vias 65, 71, and the first pads 39, 40 of the first electronic part 27 are directly connected with the corresponding vias 66, 76.

As stated, because the first electrode pads 37 through 40 of the first electronic parts 26, 27 are directly connected with the corresponding vias 65, 66, 71, 76, a thickness of the first semiconductor component 11 can be reduced when being compared with the related art semiconductor apparatus where the electronic part and the patterned wiring are electrically connected with each other via a bump or a metal wiring.

The via 72 is directly connected to the first connection surface 31A of the through electrode 31, and the via 77 is directly connected to the first connection surface 32A of the through electrode 32. In addition, the via 81 is directly connected to the first connection surface 33A of the through electrode 33.

The vias 65, 66, 71, 72, 76, 77, 81 and the wirings 67, 73, 78, 82 may be formed by, for example, a semi-additive method, and formed of, for example, copper.

Figure 9:
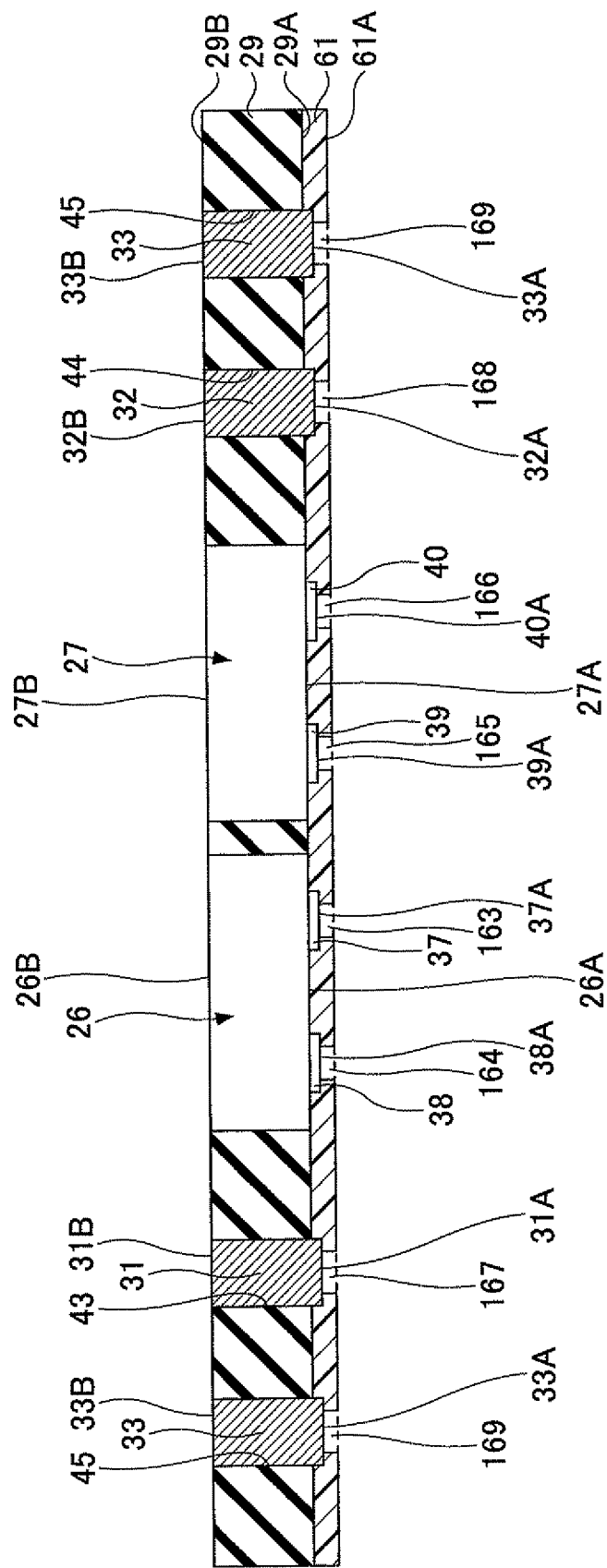
FIG. 9 is an explanatory view (part 7) for explaining the method of fabricating the electronic apparatus according to the first embodiment of the present invention.

Next, substantially the same process as explained with reference to FIG. 9 is carried out in a step illustrated in FIG. 11. As a result, the insulation layer 62 having the openings 171 through 174 is formed on the plane 61A of the insulation layer 61. With this, the stacked body 49 composed of the insulation layers 61, 62 are stacked one on the other.

The opening 171 is formed so that a part of the wiring 67 is exposed. The opening 172 is formed so that a part of the wiring 73 is exposed. The opening 173 is formed so that a part of the wiring 78 is exposed. The opening 174 is formed so that a part of the wiring 82 is exposed. The insulation layer 62 may be formed by using an epoxy resin film.

Figure 10:
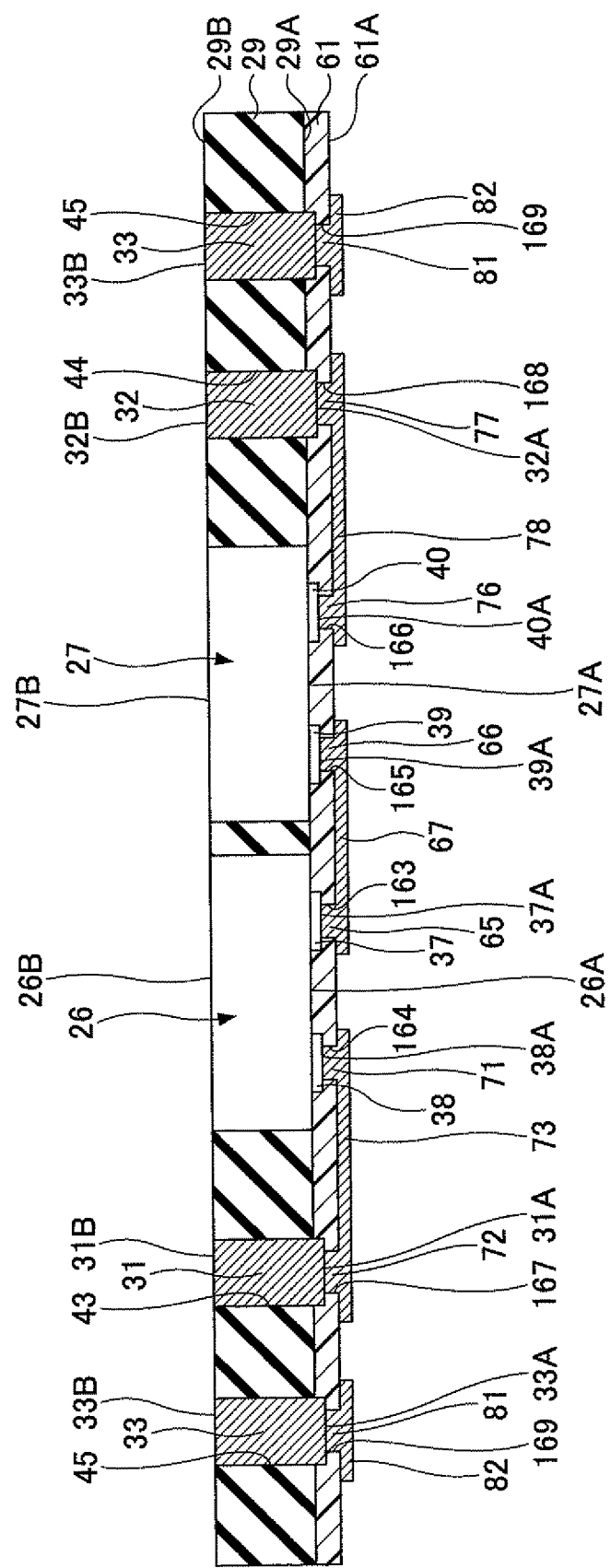
FIG. 10 is an explanatory view (part 8) for explaining the method of fabricating the electronic apparatus according to the first embodiment of the present invention.

Next, substantially the same process as explained with reference to FIG. 10 is carried out in a step illustrated in FIG. 12. As a result, the vias 68, 74, 79, 83 are formed in the corresponding openings 171, 172, 173, 174, and simultaneously the external connection pads 51, 52, 53, 54 having the corresponding connection surfaces 51A, 52A, 53A, 54A are formed on the plane 62A of the insulation layer 62.

With this, the patterned wiring 56 that electrically connects the first electronic parts 26, 27 and the external connection pad 51, the patterned wiring 57 that electrically connects the external connection pad 52 with the first electronic part 26 and the through electrode 31, the patterned wiring 58 that electrically connects the external connection pad 53 with the first electronic part 27 and the through electrode 32, and the patterned wiring 59 that electrically connects the external connection pad 54 and the through electrode 33 are formed.

The vias 68, 74, 79, 83 and the external connection pads 51, 52, 53, 54 may be made of, for example, copper.

Figure 12:
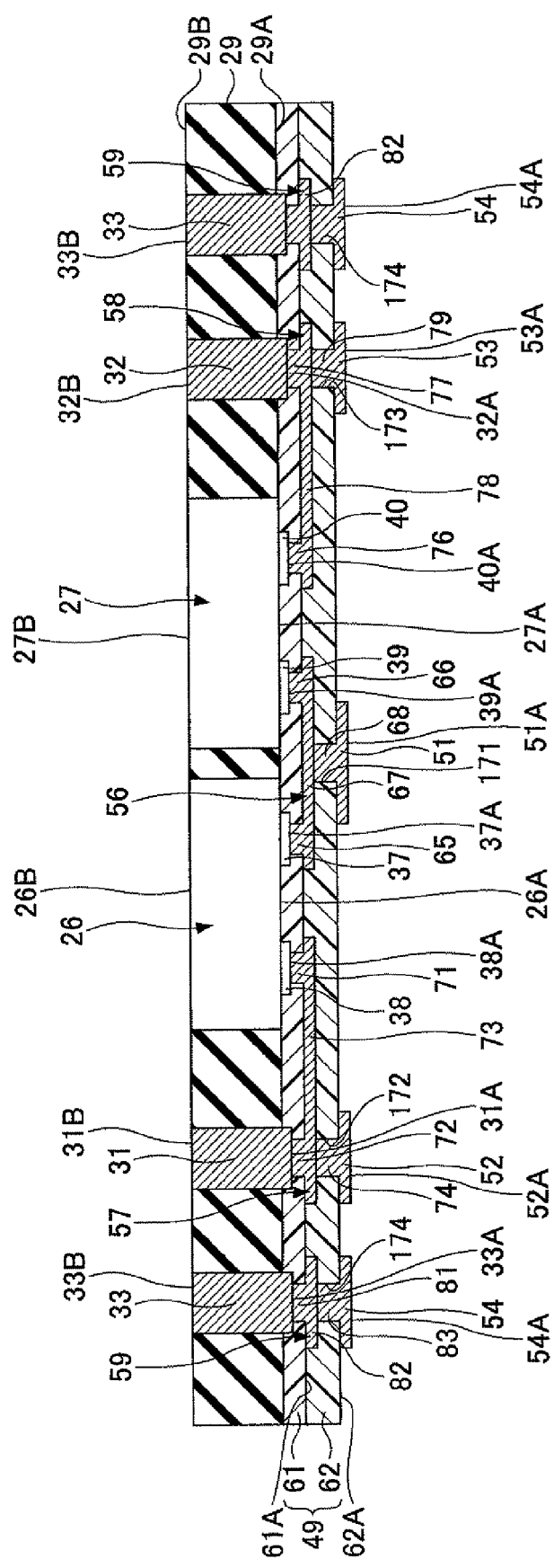
FIG. 12 is an explanatory view (part 10) for explaining the method of fabricating the electronic apparatus according to the first embodiment of the present invention.
Figure 13:
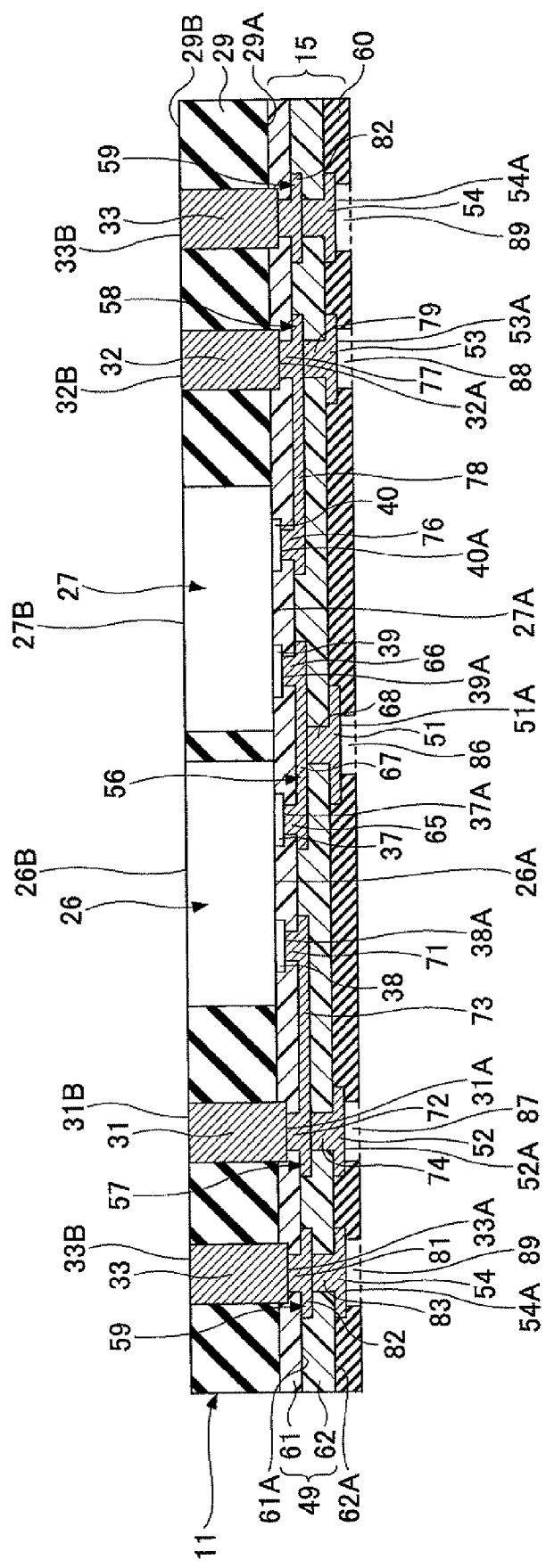
FIG. 13 is an explanatory view (part 11) for explaining the method of fabricating the electronic apparatus according to the first embodiment of the present invention.

Next, the solder resist layer 60 having the openings 86 through 89 are formed on the plane 62A of the insulation layer 62, in a step illustrated in FIG. 13. With this, the first semiconductor component 11 is completed. Incidentally, the steps illustrated in FIGS. 3 through 13 correspond to a "first semiconductor component forming step".

The opening 86 is formed so that the connection surface 51A is exposed. The opening 87 is formed so that the connection surface 52A is exposed. The opening 88 is formed so that the connection surface 53A is exposed. The opening 89 is formed so that the connection surface 54A is exposed.

Incidentally, a protection layer composed of a Ni/Au stacked layer formed by stacking a Ni electroplating layer and an Au electroplating layer in this order may be provided.

One external connection terminal may be formed on each of the connection surfaces 51A through 54A. The external connection terminal may be, for example, a solder ball, a pin terminal, or the like.

Figure 3:
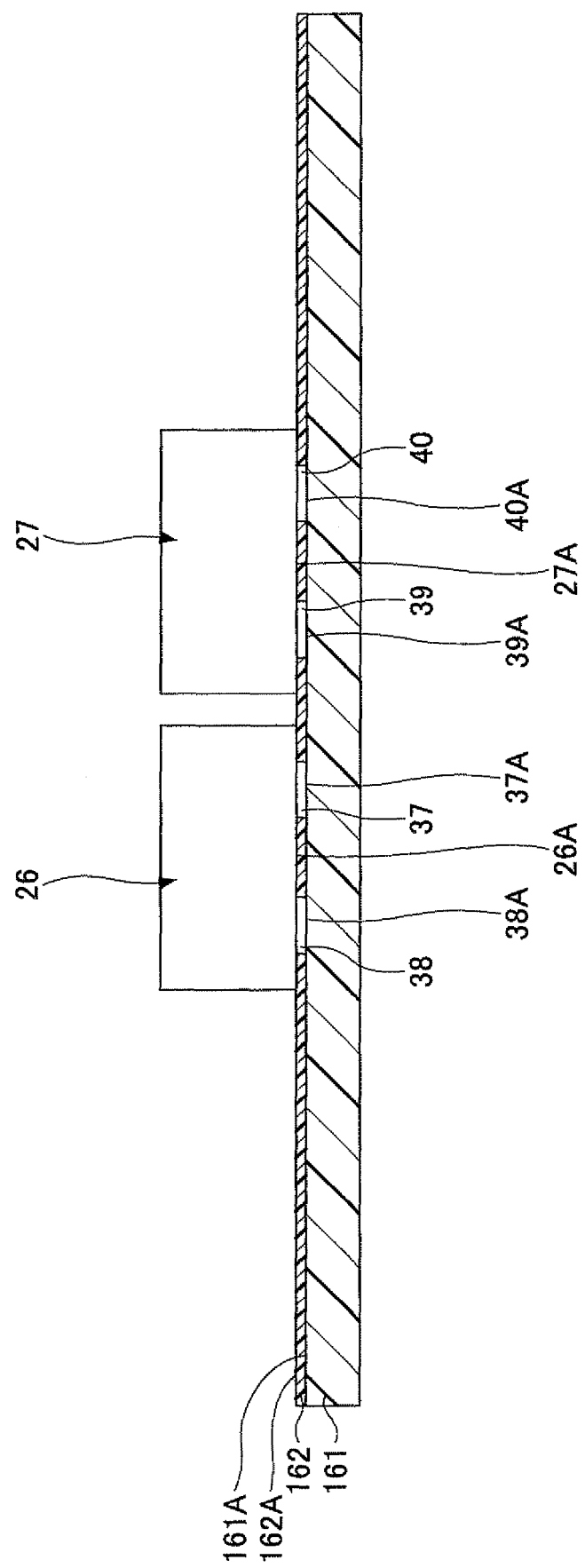
FIG. 3 is an explanatory view (part 1) for explaining a method of fabricating an electronic apparatus according to the first embodiment of the present invention.
Figure 14:
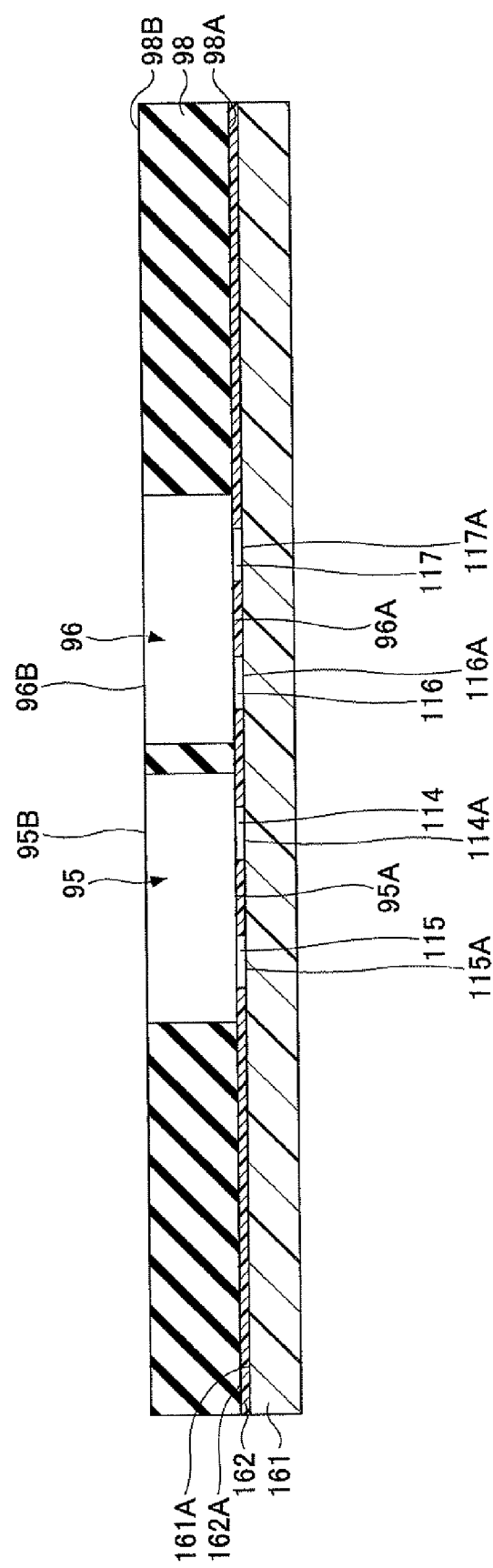
FIG. 14 is an explanatory view (part 12) for explaining the method of fabricating the electronic apparatus according to the first embodiment of the present invention.

Next, substantially the same processes as explained with reference to FIGS. 3 through 5 are carried out, in a step illustrated in FIG. 14. As a result, the thinned second electronic parts 95, 96, and the plane 98 that forms the same plane along with the back surfaces 95B, 96B of the second electronic parts 95, 96 are formed on the adhesive 162 formed on the supporting body 161.

Semiconductor chips may be used as the second electronic parts 95, 96. Specifically, both of the second electronic parts 95, 96 may be semiconductor chips such as Central Processing Units (CPUs); one of the second electronic parts 95, 96 may be a semiconductor chip such as a CPU, while the other one of the second electronic parts 95, 96 may be a semiconductor chip such as a memory; or one of the second electronic parts 95, 96 may be a semiconductor chip such as a CPU, while the other one of the second electronic parts 95, 96 may be a semiconductor chip such as a Graphics Processing Unit (GPU).

Thicknesses of the second electronic parts 95, 96 that have been thinned may be, for example, about 200 μm. A thickness of the insulation member 98 may be, for example, about 200 μm. The insulation layer 98 may be, for example, an epoxy resin.

Figure 15:
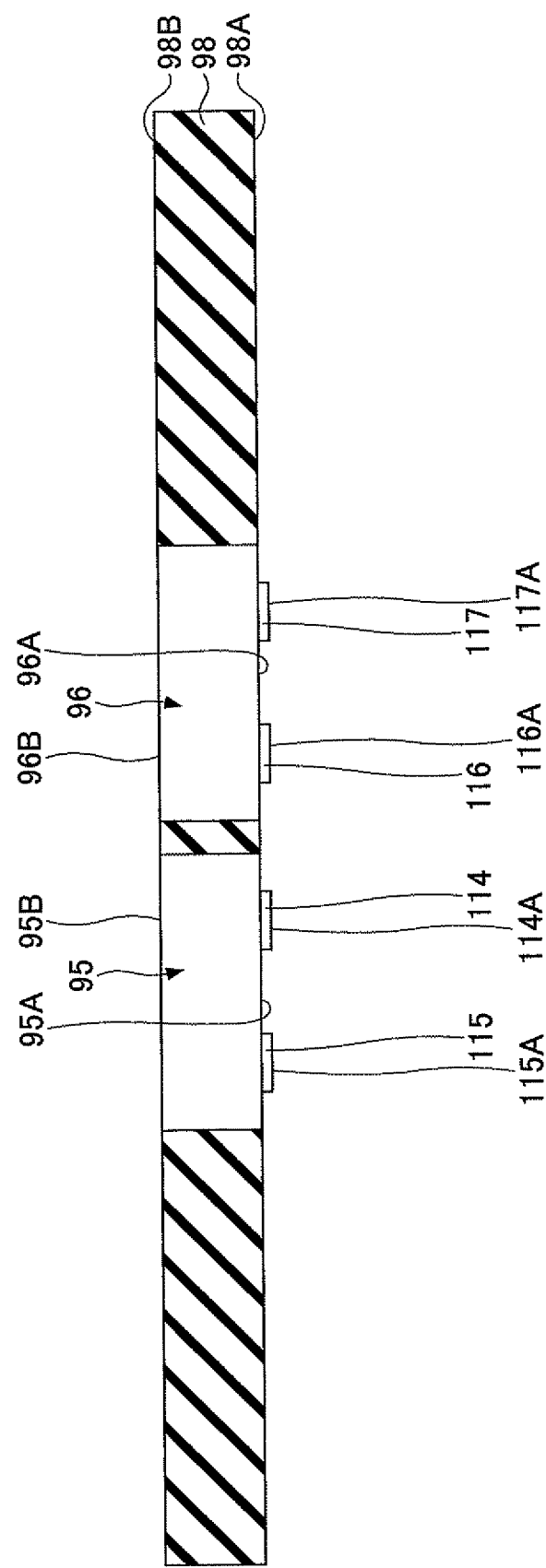
FIG. 15 is an explanatory view (part 13) for explaining the method of fabricating the electronic apparatus according to the first embodiment of the present invention.

Next, substantially the same process as explained with reference to FIG. 8 is carried out in a step illustrated in FIG. 15. As a result, the supporting body 161 and the adhesive 162 are removed from the insulation member 98 having the second electronic parts 95, 96 illustrated in FIG. 14.

Figure 16:
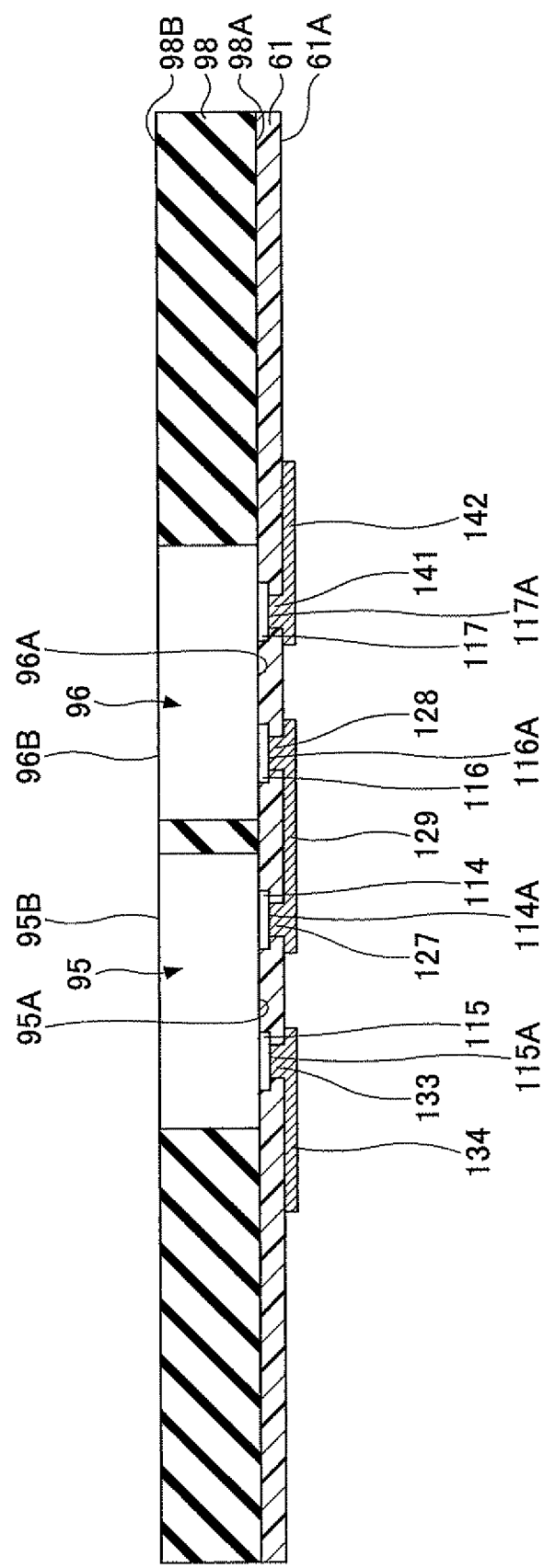
FIG. 16 is an explanatory view (part 14) for explaining the method of fabricating the electronic apparatus according to the first embodiment of the present invention.

Next, substantially the same process as explained with reference to FIG. 9 is carried out in a step illustrated in FIG. 16. As a result, the insulation layer 61 is formed that covers the multilayer wiring structure forming surface 98A, the second electrode pad forming surfaces 95A, 96A, and the second electrode pads 114 through 117. In addition, substantially the same process as explained with reference to FIG. 10 is carried out, so that the vias 127, 128, 133, 141 and the wirings 129, 134, 142 are simultaneously formed.

The vias 127, 128, 133, 141 are formed to be directly connected to the connection surfaces 114A, 116A, 115A, 117A of the second electrode pads 114, 116, 115, 117, respectively.

The wiring 129 is formed integrally with the vias 127, 128. The wiring 134 is formed integrally with the via 133. The wiring 142 is formed integrally with the via 141.

The vias 127, 128, 133, 141 and the wirings 129, 134, 142 may be made of, for example, copper.

Figure 11:
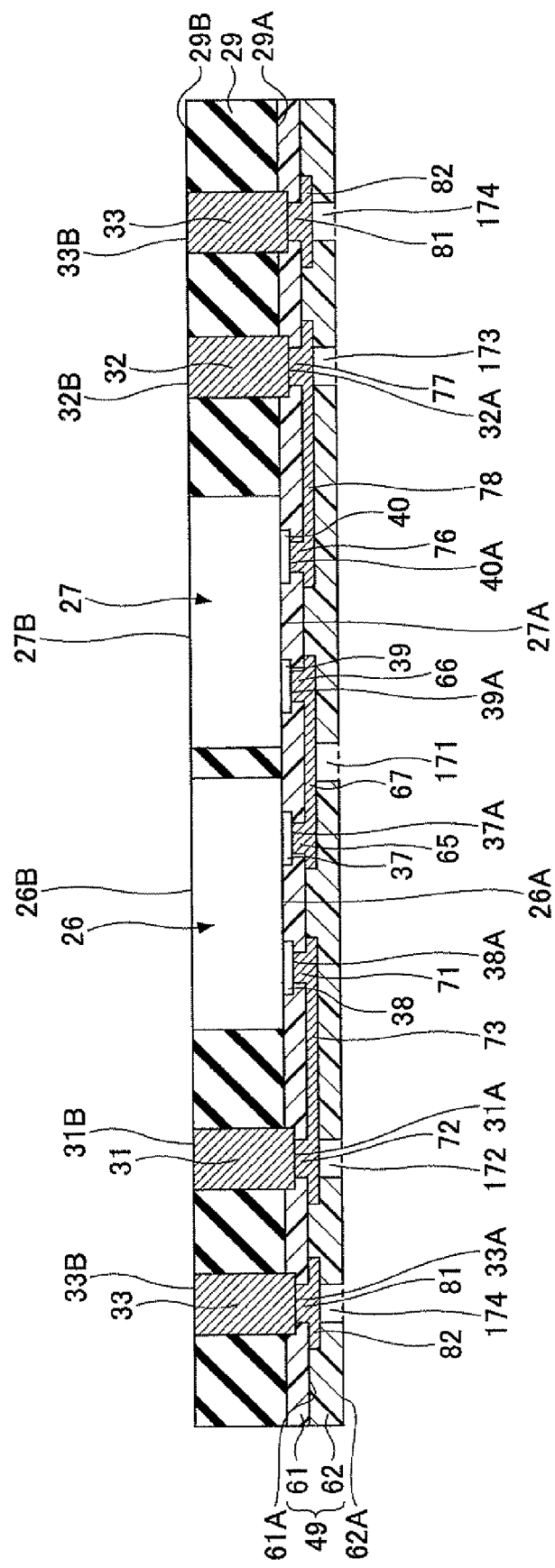
FIG. 11 is an explanatory view (part 9) for explaining the method of fabricating the electronic apparatus according to the first embodiment of the present invention.

Next, substantially the same process as explained with reference to FIG. 11 is carried out in a step illustrated in FIG. 17. As a result, the insulation layer 62 is formed on the plane 61A of the insulation layer 61 and the wirings 129, 134, 142. With this, the stacked body 121 composed of the insulation layers 61, 62 is formed.

Next, substantially the same process as explained with reference to FIG. 12 is carried out to simultaneously form the vias 135, 143 and the wirings 131, 136, 145. With this, the wiring patterns 123 through 125 are formed on the stacked body 121, and thus the multilayer wiring structure 99 is formed.

The vias 135, 143, 131 are formed to be connected to the wirings 134, 142, 129, respectively. The wirings 136, 145 are formed integrally with the vias 135, 143, respectively.

The vias 135, 143 and the wirings 131, 136, 145 may be made of, for example, copper.

Figure 17:
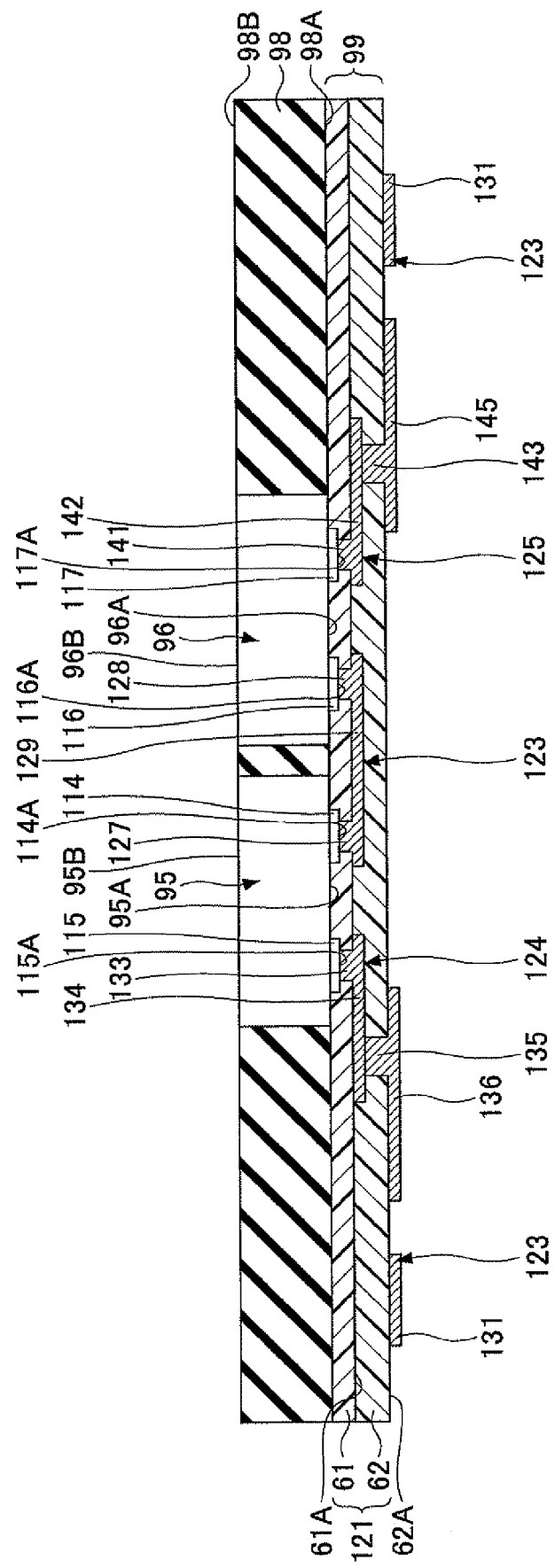
FIG. 17 is an explanatory view (part 15) for explaining the method of fabricating the electronic apparatus according to the first embodiment of the present invention.
Figure 18:
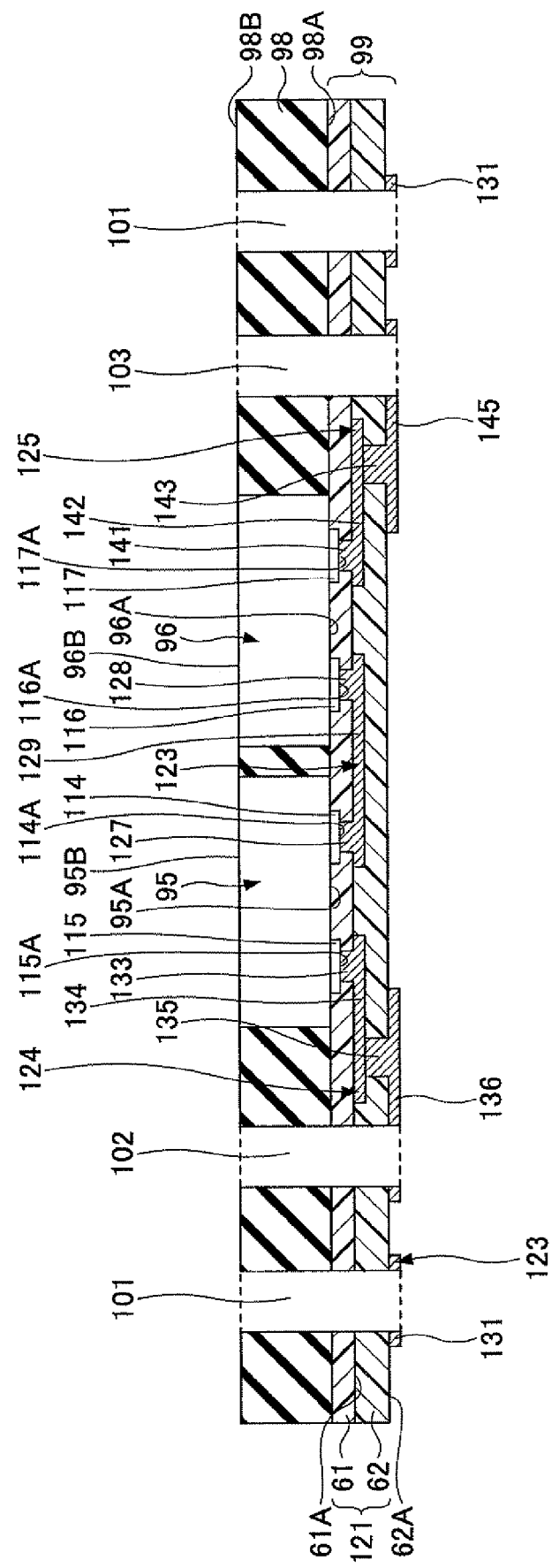
FIG. 18 is an explanatory view (part 16) for explaining the method of fabricating the electronic apparatus according to the first embodiment of the present invention.

Next, the through holes (first through holes) 101 through 103 that go through the structure illustrated in FIG. 17 are formed in a step illustrated in FIG. 18. The through hole 101 is formed to go through the insulation member 98, the stacked body 121, and the wiring 131. The through hole 102 is formed to go through the insulation member 98, the stacked body 121, and the wiring 136. The through hole 103 is formed to go through the insulation member 98, the stacked body 121 and the wiring 145.

Specifically, the through holes 101 through 103 are formed by, for example, laser machining or drilling. Diameters of the through holes 101 through 103 may be, for example, about 100 μm.

Figure 19:
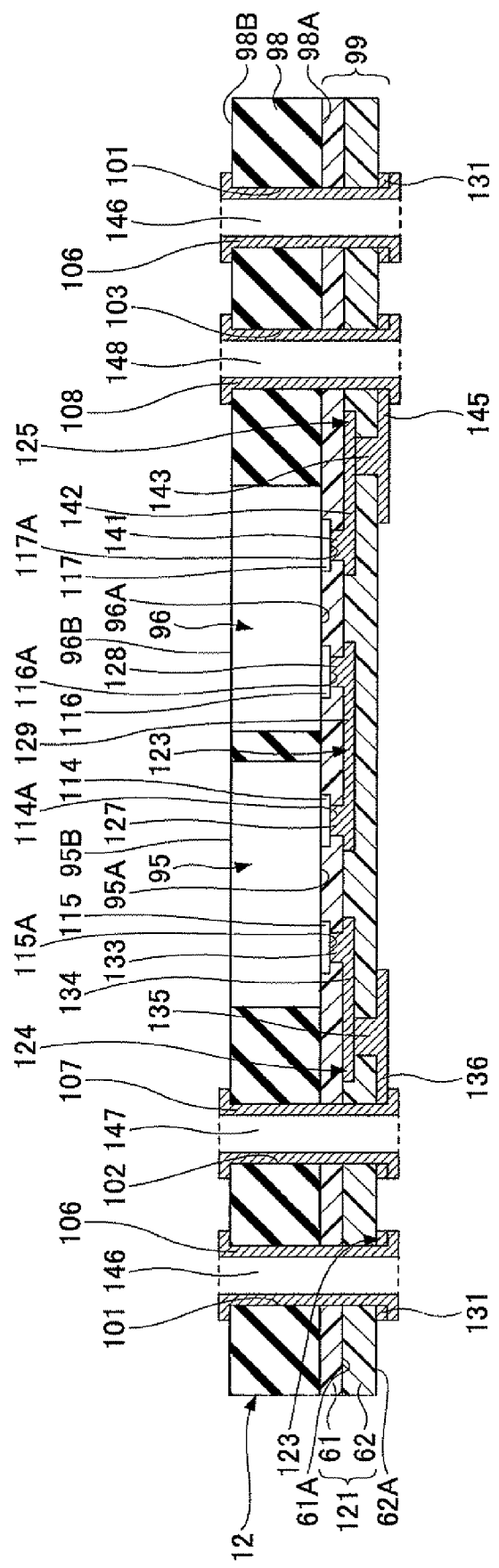
FIG. 19 is an explanatory view (part 17) for explaining the method of fabricating the electronic apparatus according to the first embodiment of the present invention.

Next, the through electrodes (second through electrodes) 106 through 108 are formed in a step illustrated in FIG. 19. The through electrode 106 is formed on an inner surface of the through hole 101 (including a side surface of the wiring 131), a part of the plane 98B of the insulation member 98, and a lower surface of the wiring 131.

The through electrode 107 is formed on an inner surface of through hole 102 (including a side surface of the wiring 136), a part of the plane 98B of the insulation member 98, and a lower surface of the wiring 136. The through electrode 108 is formed on an inner surface of the through hole 103 (including a side surface of the wiring 145), a part of the plane 98B of the insulation member 98, and a lower surface of the wiring 145.

Specifically, the through electrodes 106 through 108 may be formed by executing a nonelectrolytic plating method to form a nonelectrolytic copper film and then an electrolytic plating method to form an electrolytic copper film on the nonelectrolytic copper film. In this case, the through electrodes 106 through 108 are composed of the nonelectrolytic copper film and the electrolytic copper film.

With this, the second semiconductor component 12 is completed. Incidentally, the steps illustrated in FIGS. 14 through 19 correspond to a "second semiconductor component forming step".

Next, the second semiconductor component illustrated in FIG. 19 is attached on the first semiconductor component 11 illustrated in FIG. 13 via the adhesion layer 13 (semiconductor component attaching step). Specifically, the first semiconductor component 11 and the second semiconductor component 12 are bonded with each other by applying the adhesion layer 13 between the semiconductor component 11 and the second semiconductor component 12 so that the back surfaces 26B, 27B of the corresponding first electronic parts 26, 27 oppose the multilayer wiring structure 99.

The adhesion layer 13 may be made of, for example, an insulation resin having adhesiveness (e.g., an epoxy resin). A thickness of the adhesion layer 13 may be, for example, about 50 µm.

Figure 21:
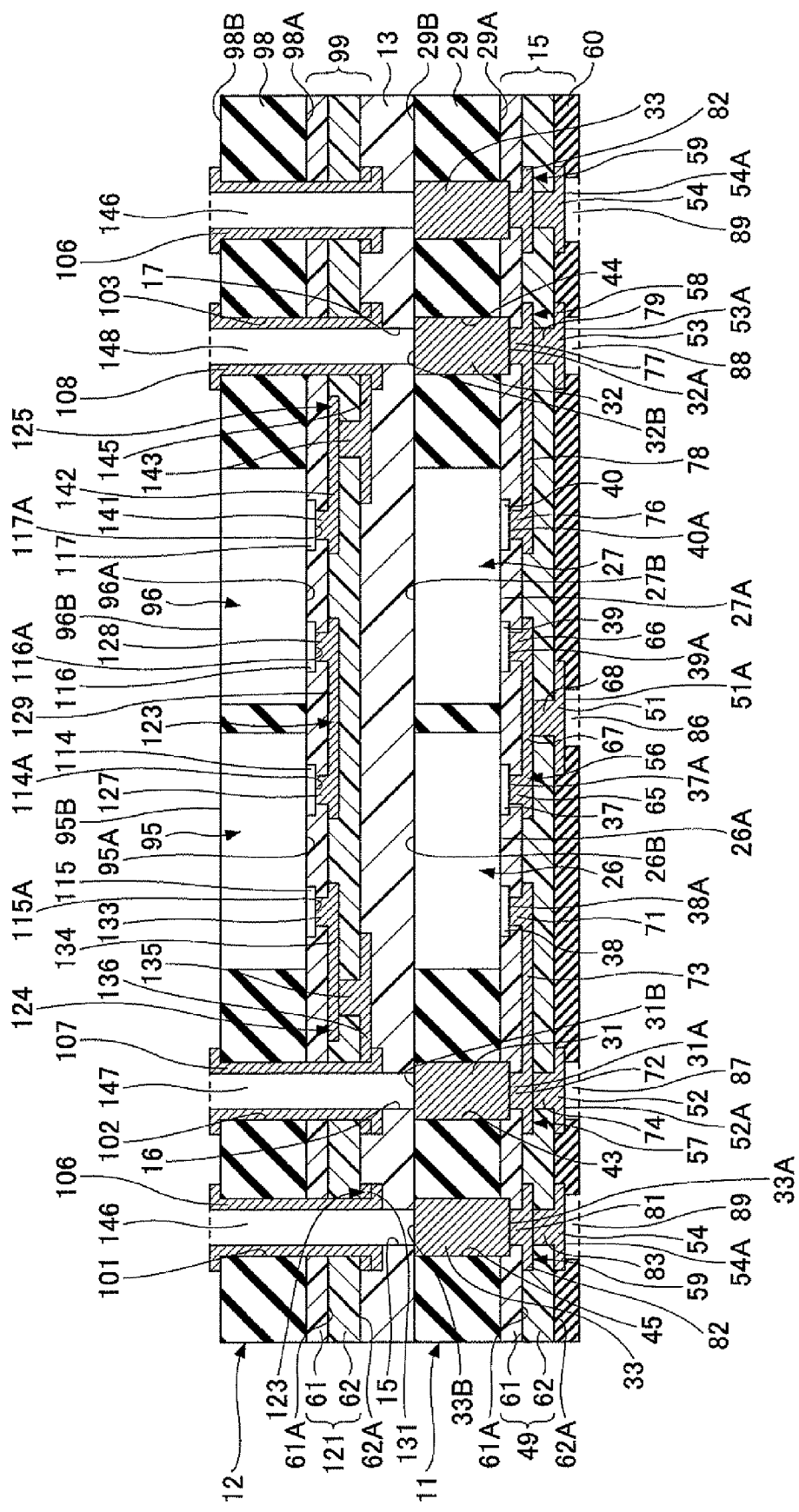
FIG. 21 is an explanatory view (part 19) for explaining the method of fabricating the electronic apparatus according to the first embodiment of the present invention.

Next, in a step illustrated in FIG. 21, the through holes (third through holes) 15 through 17 are formed that go through portions of the adhesion layer 13, the portions being positioned between the through holes 146 through 148 and the second connection surfaces 31B, 32B, 33B of the through electrodes 31 through 33, and are formed integrally with the corresponding through holes 146 through 148. With this, the second connection surfaces 31B, 32B, 33B of the through electrodes 31, through 33 are exposed through the through holes 15 through 17, respectively.

The through hole 15 is formed to go through a portion of the adhesion layer 13, the portion being positioned between the through hole 146 and the second connection surface 33B of the through electrode 33. The through hole 16 is formed to go through a portion of the adhesion layer 13, the portion being positioned between the through hole 147 and the connection surface 31B of the through electrode 31. The through hole 17 is formed to go through a portion of the adhesion layer 13, the portion being positioned between the through hole 148 and the connection surface 32B of the through electrode 32.

Specifically, the through holes 15 through 17 are formed by laser-machining the portions of the adhesion layer 13 between the through holes 146 through 148 and the connection surfaces 31B, 32B, 33B, respectively. Diameters of the through holes 15 through 17 may be, for example, about 80 µm.

Figure 22:
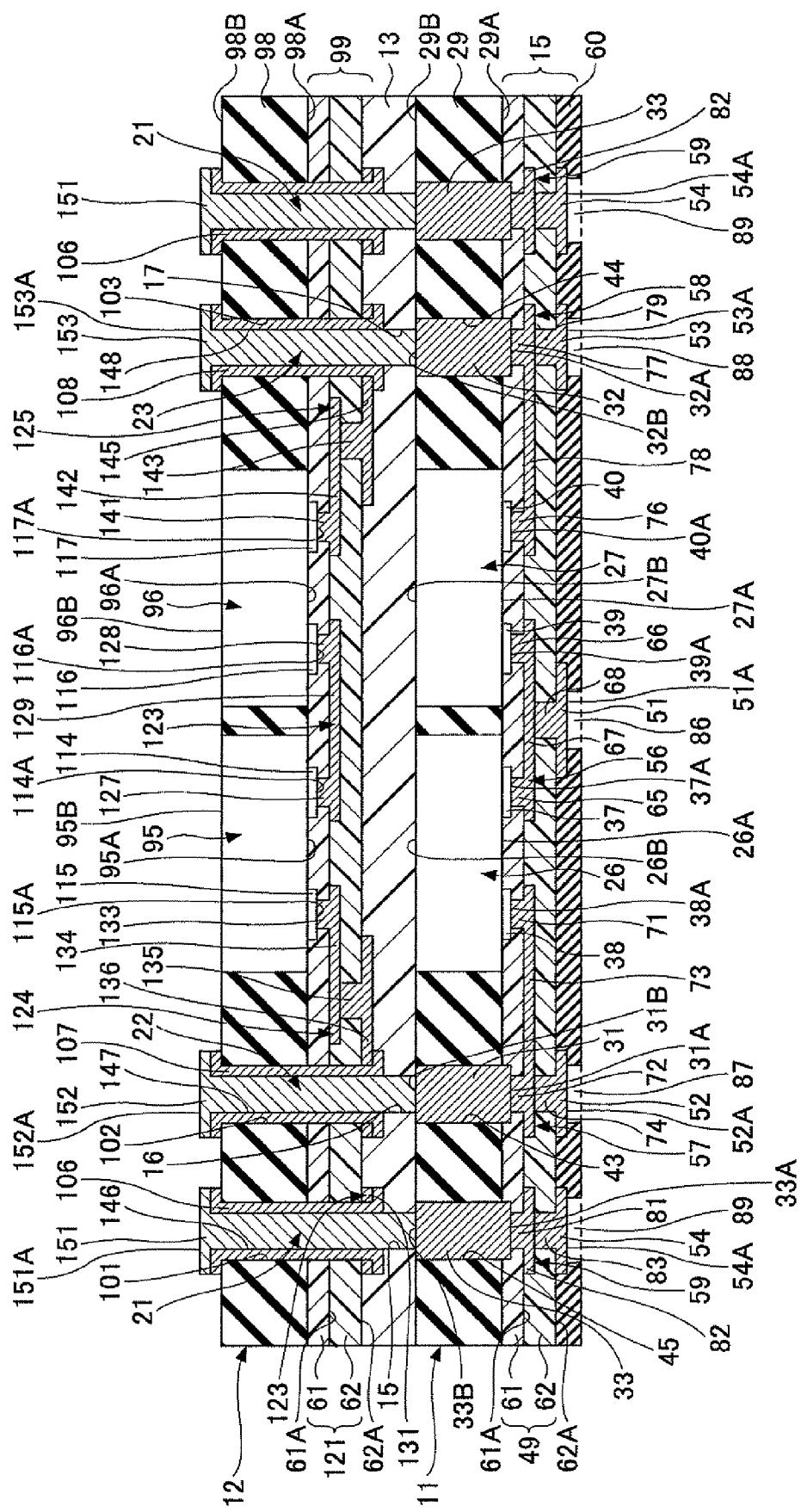
FIG. 22 is an explanatory view (part 20) for explaining the method of fabricating the electronic apparatus according to the first embodiment of the present invention.

Next, in a step illustrated in FIG. 22, the through holes 15, 146 are filled to form the through electrode 21 including the external connection pad portion 151 provided in a protruding portion of the through electrode 106 from the plane 98B of the insulation member 98; the through holes 16, 147 are filled to form the through electrode 22 including the external connection pad portion 152 provided in a protruding portion of the through electrode 107 from the plane 98B of the insulation member 98; and the through holes 17, 148 are filled to form the through electrode 23 including the external connection pad portion 153 provided in a protruding portion of the through electrode 108 from the plane 98B of the insulation member 98. The through electrodes 21, 22, 23 are simultaneously formed in this step (third through electrode forming step).

With this, the through electrode 21 is connected to the through electrode 33, 106; the through electrode 22 is connected to the through electrode 31, 107; and the through electrode 23 is connected to the through electrode 32, 108. Namely, the through electrodes 21 through 23 electrically connect the first semiconductor component 11 and the second semiconductor component 12.

In the above manner, the first semiconductor component 11 and the second semiconductor component 12 are attached with each other via the adhesion layer 13; the through holes 15 through 17 are formed to go through portions of the adhesion layer 13, the portions being positioned between the through holes 146 through 148 and the corresponding second connection surfaces 31B, 32B, 332 of the corresponding through electrodes 31, 32, 33, so that the through holes 15, 16, 17 are continuous with the through holes 146, 147, 148, respectively; and the through electrode 21 that fills the through holes 15, 146, the through electrode 22 that fills the through holes 16, 147, and the through electrode 23 that fills the through holes 17, 148 are simultaneously formed. Therefore, the first semiconductor component 11 and the second semiconductor component 12 are electrically connected without using an inner connection terminal (not shown), for example, a solder ball, thereby reducing a thickness of the electronic apparatus 10.

In addition, because the first semiconductor component 11 and the second semiconductor component 12 are electrically connected with each other via the through electrodes 21 through 23, reliability of electrical connection between the first semiconductor component 11 and the second semiconductor component 12 can be improved when being compared with a case where the first semiconductor component 11 and the second semiconductor component are connected with each other via the internal connection terminal, for example, a solder ball.

Specifically, the through electrodes 21 through 23 may be formed by executing a nonelectrolytic plating method to form a nonelectrolytic copper film and then an electrolytic plating method to form an electrolytic copper film on the nonelectrolytic copper film. In this case, the through electrodes 21 through 23 are composed of the nonelectrolytic copper film and the electrolytic copper film.

Figure 23:
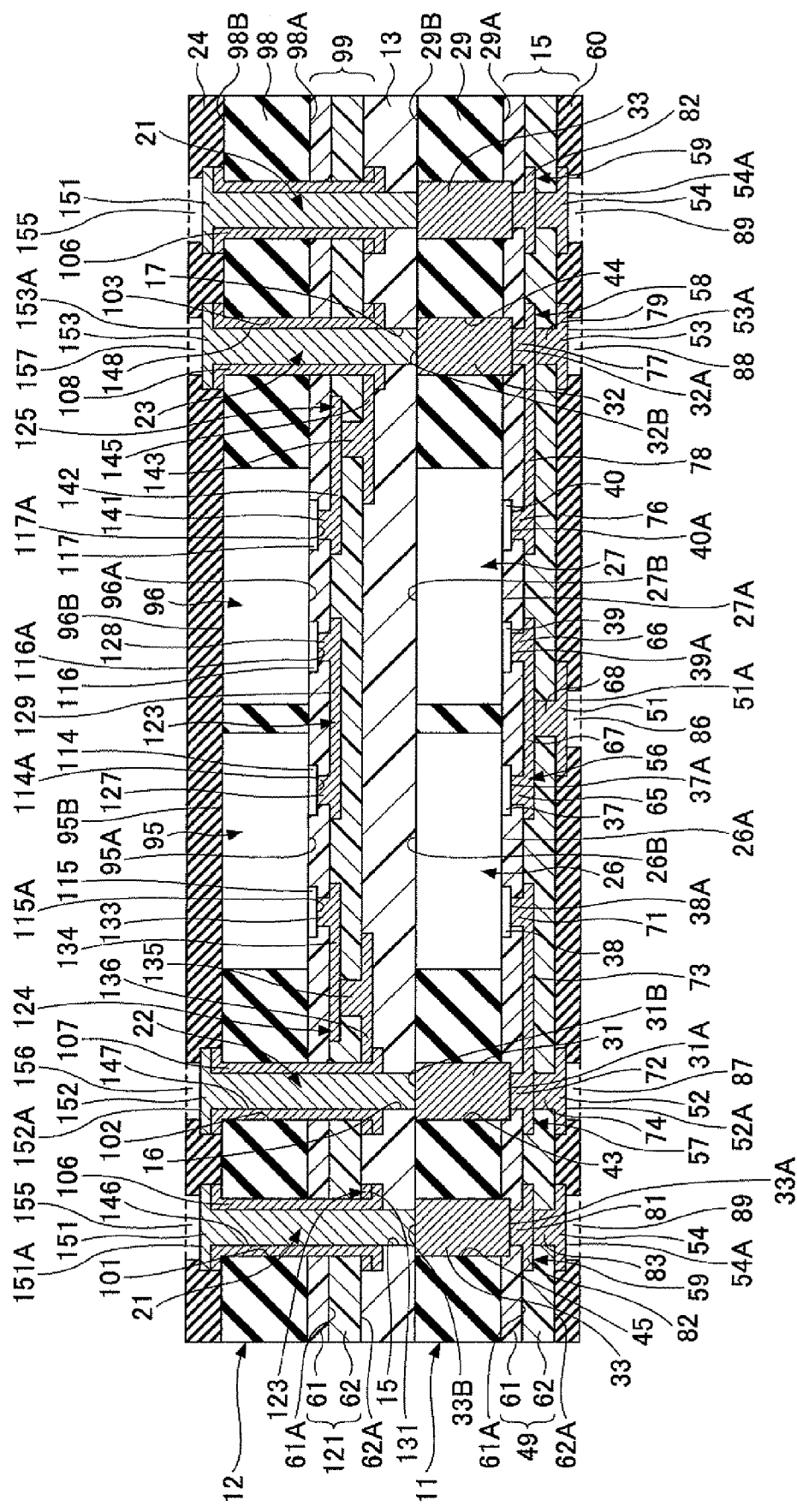
FIG. 23 is an explanatory view (part 21) for explaining the method of fabricating the electronic apparatus according to the first embodiment of the present invention.

Next, in a step illustrated in FIG. 23, the solder resist layer 24 having the openings 155 through 157 is formed to cover the back surfaces 95B, 96B of the corresponding second electronic parts 95, and the plane 98B of the insulation member 98. With this, the electronic apparatus 10 according to the first embodiment of the present invention is fabricated.

The openings 155, 156, 157 are formed to expose the connection surfaces 151A, 152A, 153A of the external connection pads 151, 152, 153, respectively.

According to the fabrication method of the embodiment of the present invention, the first semiconductor component 11 and the second semiconductor component 12 are attached with each other via the adhesion layer 13; the through holes 15 through 17 are formed to go through portions of the adhesion layer 13, the portions being positioned between the through holes 146 through 148 and the corresponding second connection surfaces 31B, 32B, 33B of the corresponding through electrodes 31, 32, 33, so that the through holes 15, 16, 17 are continuous with the through holes 146, 147, 148, respectively; and the through electrode 21 that fills the through holes 15, 146, the through electrode 22 that fills the through holes 16, 147, and the through electrode 23 that fills the through holes 17, 148 are simultaneously formed. Therefore, the first semiconductor component 11 and the second semiconductor component 12 are electrically connected without using an inner connection terminal (not shown), for example, a solder ball, thereby reducing a thickness of the electronic apparatus 10.

In addition, because the first semiconductor component 11 and the second semiconductor component 12 are electrically connected with each other via the through electrodes 21 through 23, reliability of electrical connection between the first semiconductor component 11 and the second semiconductor component 12 can be improved when being compared with a case where the first semiconductor component 11 and the second semiconductor component are connected with each other via the internal connection terminal, for example, a solder ball.

Second Embodiment

Figure 24:
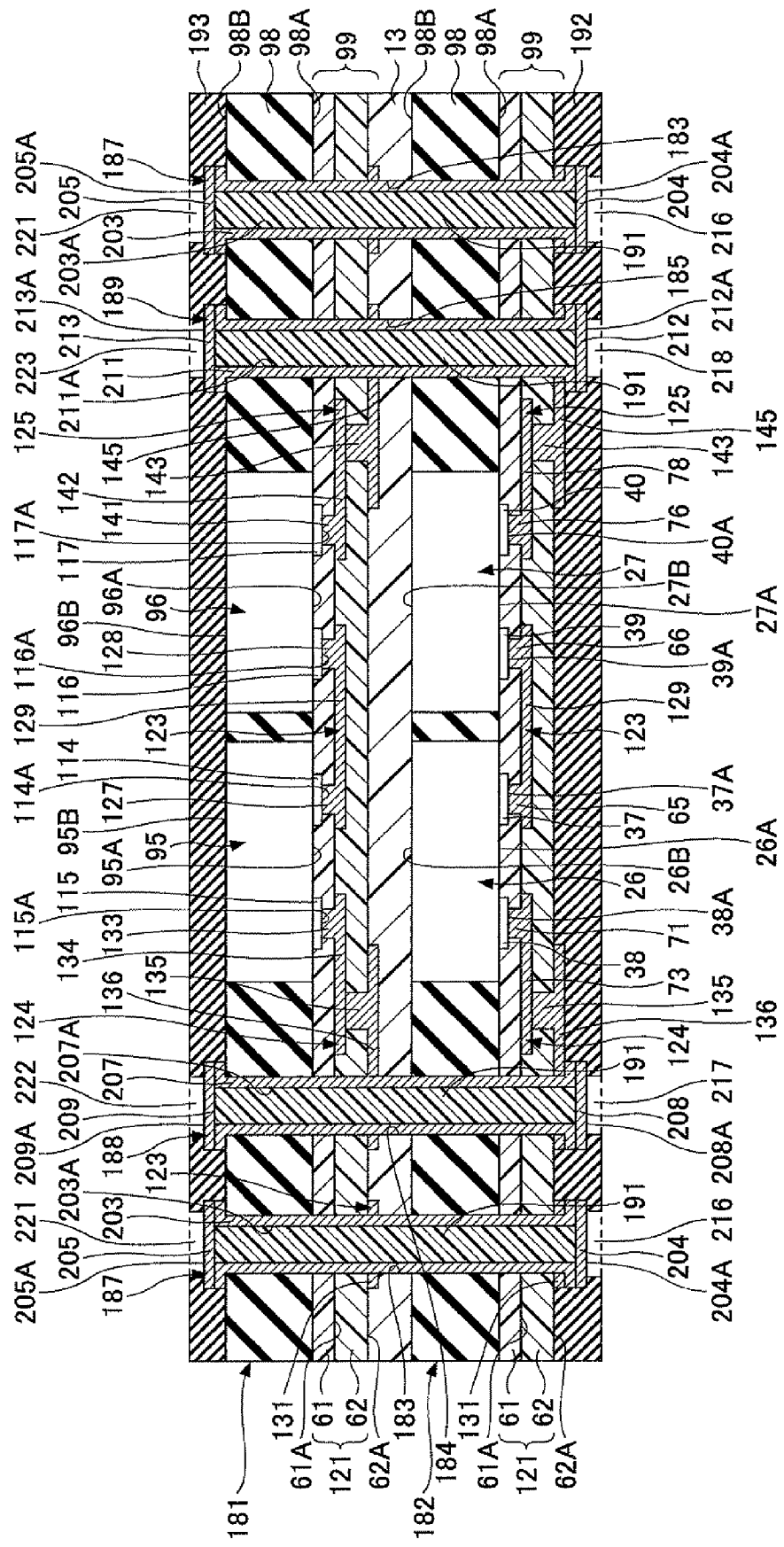
FIG. 24 is a cross-sectional view of an electronic apparatus according to a second embodiment of the present invention.

FIG. 24 is a cross-sectional view of an electronic apparatus according to a second embodiment of the present invention.

In this drawing, the same or corresponding reference symbols are given to the same or corresponding components or parts as those of the electronic apparatus 10 according to the first embodiment.

Referring to FIG. 24, an electronic apparatus 180 according to the second embodiment includes a second semiconductor component 181, a first semiconductor component 182, through holes 183 through 185, through electrodes 187 through 189, a resin 191, and solder resist layers 192, 193. First, the second semiconductor component 181 is described in the following, for the sake of convenience.

The second semiconductor component 181 has substantially the same configurations as the second semiconductor component 12 provided in the first electronic apparatus 10, but the second semiconductor component 181 does not include the through holes 101 through 103, 146 through 148, and the through electrodes 106 through 108 of the first electronic apparatus 10.

The first semiconductor component 182 has substantially the same configurations as the second semiconductor component 181, while the first semiconductor component 182 includes electronic parts that are the same as the electronic parts 26, 27 of the first semiconductor component 11 of the first electronic apparatus 10, in the place of the second electronic parts 95, 96 of the second semiconductor component 181.

Side surfaces of the first electronic parts 26, 27 are sealed by the insulation member 98 (first insulation member, in this case). Electrode pad forming surfaces 26A, 27A of the corresponding first electronic parts 26, 27 form the same plane along with the multilayer wiring structure forming surface 98A (first multilayer wiring structure forming surface). The electrode pads 37, 38 are directly connected to the patterned wiring 123 (first patterned wiring, in this case). The electrode pad 38 is directly connected to the patterned wiring 124 (first patterned wiring, in this case). The electrode pad 40 is directly connected to the patterned wiring 125 (first patterned wiring).

The second semiconductor component 181 is attached on the first semiconductor component 182 with the adhesion layer 13 therebetween so that the multilayer wiring structure 99 formed in the second semiconductor component 181 opposes the back surfaces 26B, 27B of the first electronic parts 26, 27 provided in the first semiconductor component 182.

The through hole 183 is formed to go through the insulation member 98, the multilayer wiring structure 99, the wiring 131, which are provided in the second semiconductor component 181; the adhesion layer 13; and the insulation member 98, the multilayer wiring structure 99, the wiring 131, which are provided in the first semiconductor component 182. A diameter of the through hole 183 may be, for example, about 100 μm.

The through hole 184 is formed to go through the insulation member 98, the multilayer wiring structure 99, the wiring 136, which are provided in the second semiconductor component 181; the adhesion layer 13; and the insulation member 98, the multilayer wiring structure 99, the wiring 136, which are provided in the first semiconductor component 182. A diameter of the through hole 184 may be, for example, about 100 μm.

The through hole 185 is formed to go through the insulation member 98, the multilayer wiring structure 99, the wiring 145, which are provided in the second semiconductor component 181; the adhesion layer 13; and the insulation member 98, the multilayer wiring structure 99, the wiring 145, which are provided in the first semiconductor component 182. A diameter of the through hole 185 may be, for example, about 100 μm.

The through electrode 187 includes a through electrode body 203, a first external connection pad portion 204, and a second external connection pad portion 205. The through electrode body 203 is formed on an inner surface of the through hole 183 (including an inner surface of the wiring 131), a part of the plane 62A of the insulation layer 62, the part being close to one end portion of the through hole 183, and a part of the plane 98B of the insulation member 98, the part being close to the other end portion of the through hole 183. With this, the through electrode 187 is connected to the wiring 131 provided in the second semiconductor component 181 and the wiring 131 provided in the first semiconductor component 182. Therefore, the through electrode 187 electrically connects the first semiconductor component 182 and the second semiconductor component 181. The through electrode body 203 includes a through hole 203A in the center. The through hole 203A is filled with the resin 191. The through electrode body 203 may be made of, for example, copper.

The first external connection pad portion 204 is provided on a lower surface of a part of the through electrode body 203, the part being formed on the plane 62A of the insulation layer 62, and a lower surface of the resin 191, in order to close one end portion of the through hole 203A. The first external connection pad portion 204 is positioned below the multilayer wiring structure 99 of the first semiconductor component 182. The first external connection pad portion 204 includes the connection surface 204A to which an external connection terminal (not shown) is connected. The first external connection pad portion 204 serves as a pad to which other semiconductor components (not shown), a mounted substrate such as a mother board (not shown), or the like are connected. The first external connection pad portion 204 may be made of, for example, copper.

The second external connection pad portion 205 is provided on an upper surface of a part of the through electrode body 203, the part being formed on the plane 98B of the insulation member 98, and an upper surface of the resin 191, in order to close the other end portion of the through hole 203A. The second external connection pad portion 205 is positioned above the plane 983 of the insulation member 98 of the second semiconductor component 181. The second external connection pad portion 205 includes the connection surface 205A to which an external connection terminal (not shown) is connected. The second external connection pad portion 205 serves as a pad to which other semiconductor components (not shown), a mounted substrate such as a mother board (not shown), or the like are connected. The second external connection pad portion 205 may be made of, for example, copper.

The through electrode 188 includes a through electrode body 207, a first external connection pad portion 208, and a second external connection pad portion 209. The through electrode body 207 is formed on an inner surface of the through hole 184 (including an inner surface of the wiring 131), a part of the plane 62A of the insulation layer 62, the part being close to one end portion of the through hole 184, and a part of the plane 98B of the insulation member 98, the part being close to the other end portion of the through hole 184. With this, the through electrode 188 is connected to the wiring 136 provided in the second semiconductor component 181 and the wiring 136 provided in the first semiconductor component 182. Therefore, the through electrode 188 electrically connects the first semiconductor component 182 and the second semiconductor component 181. The through electrode body 207 includes a through hole 207A in the center. The through hole 207A is filled with the resin 191. The through electrode body 207 may be made of, for example, copper.

The first external connection pad portion 208 is provided on a lower surface of a part of the through electrode body 207, the part being formed on the plane 62A of the insulation layer 62, and a lower surface of the resin 191, in order to close one end portion of the through hole 207A. The first external connection pad portion 208 is positioned below the multilayer wiring structure 99 of the first semiconductor component 182. The first external connection pad portion 208 includes the connection surface 208A to which an external connection terminal (not shown) is connected. The first external connection pad portion 208 serves as a pad to which other semiconductor components (not shown), a mounted substrate such as a mother board (not shown), or the like are connected. The first external connection pad portion 208 may be made of, for example, copper.

The second external connection pad portion 209 is provided on an upper surface of a part of the through electrode body 207, the part being formed on the plane 98B of the insulation member 98, and an upper surface of the resin 191, in order to close the other end portion of the through hole 207A. The second external connection pad portion 209 is positioned above the plane 985 of the insulation member 98 of the second semiconductor component 181. The second external connection pad portion 209 includes the connection surface 209A to which an external connection terminal (not shown) is connected. The second external connection pad portion 209 serves as a pad to which other semiconductor components (not shown), a mounted substrate such as a mother board (not shown), or the like are connected. The second external connection pad portion 209 may be made of, for example, copper.

The through electrode 189 includes a through electrode body 211, a first external connection pad portion 212, and a second external connection pad portion 213. The through electrode body 211 is formed on an inner surface of the through hole 185 (including an inner surface of the wiring 145), a part of the plane 62A of the insulation layer 62, the part being close to one end portion of the through hole 185, and a part of the plane 985 of the insulation member 98, the part being close to the other end portion of the through hole 185. With this, the through electrode 189 is connected to the wiring 145 provided in the second semiconductor component 181 and the wiring 145 provided in the first semiconductor component 182. Therefore, the through electrode 189 electrically connects the first semiconductor component 182 and the second semiconductor component 181. The through electrode body 211 includes a through hole 211A in the center. The through hole 211A is filled with the resin 191. The through electrode body 211 may be made of, for example, copper.

The first external connection pad portion 212 is provided on a lower surface of a part of the through electrode body 211, the part being formed on the plane 62A of the insulation layer 62, and a lower surface of the resin 191, in order to close one end portion of the through hole 211A. The first external connection pad portion 212 is positioned below the multilayer wiring structure 99 of the first semiconductor component 182. The first external connection pad portion 212 includes the connection surface 212A to which an external connection terminal (not shown) is connected. The first external connection pad portion 212 serves as a pad to which other semiconductor components (not shown), a mounted substrate such as a mother board (not shown), or the like are connected. The first external connection pad portion 212 may be made of, for example, copper.

The second external connection pad portion 213 is provided on an upper surface of a part of the through electrode body 211, the part being formed on the plane 98B of the insulation member 98, and an upper surface of the resin 191, in order to close the other end portion of the through hole 211A. The second external connection pad portion 213 is positioned above the plane 98B of the insulation member 98 of the second semiconductor component 181. The second external connection pad portion 213 includes the connection surface 213A to which an external connection terminal (not shown) is connected. The second external connection pad portion 213 serves as a pad to which other semiconductor components (not shown), a mounted substrate such as a mother board (not shown), or the like are connected. The second external connection pad portion 213 may be made of, for example, copper.

As explained above, the second semiconductor component 181 is attached on the first semiconductor component 182 via the adhesion layer 13; and the through electrodes 187 through 189 that are connected to the corresponding patterned wirings 123 through 125 formed in the first semiconductor component 182 and the second semiconductor component 181. Therefore, the first semiconductor component 182 and the second semiconductor component 181 can be electrically connected to each other without using an internal connection terminal (e.g., a solder ball), thereby reducing a thickness of the electronic apparatus 108.

In addition, because the first semiconductor component 182 and the second semiconductor component 181 are electrically connected with each other via the through electrodes 187 through 189, reliability of electrical connection between the first semiconductor component 182 and the second semiconductor component 181 can be improved when being compared with a case where the first semiconductor component 182 and the second semiconductor component 181 are connected with each other via the internal connection terminal, for example, a solder ball.

The first external connection pad portions 204, 208, 212 and the second external connection pad portions 205, 209, 213 may be wider than diameters of the through holes 183, 184, 185, respectively. With this, other semiconductor components (not shown), a mounted substrate such as a mother board (not shown), or the like are certainly connected to the first external connection pad portions 204, 208, 212 and the second external connection pad portions 205, 209, 213 via the external connection terminals (not shown).

The resin 191 fills the through holes 203A, 207A, 211A. The resin 191 may be made of, for example, an epoxy resin.

The solder resist layer 192 is formed on the plane 62A of the insulation layer 62 and the wirings 136, 145. The solder resist layer 192 includes the openings 216 through 218. The opening 216 is formed so that the connection surface 204A of the first connection pad portion 204 is exposed. The opening 217 is formed so that the connection surface 208A of the first external connection pad portion 208 is exposed. The opening 218 is formed so that the connection surface 212A of the first external connection pad portion 212 is exposed.

The solder resist layer 193 is formed on the plane 98A of the insulation member 98 and the back surfaces 95B, 96B of the second electronic parts 95, 96. The solder resist layer 193 includes the openings 221 through 223. The opening 221 is formed so that the connection surface 205A of the second connection pad portion 205 is exposed. The opening 222 is formed so that the connection surface 209A of the second external connection pad portion 209 is exposed. The opening 223 is formed so that the connection surface 213A of the second external connection pad portion 213 is exposed.

According to the electronic apparatus of this embodiment, the second semiconductor component 181 is attached on the first semiconductor component 182 via the adhesion layer 13; and the through electrodes 187 through 189 that go through the first semiconductor component 182 and the second semiconductor component 181 are formed to be connected to the corresponding patterned wirings 123 through 125 formed in the first semiconductor component 182 and the second semiconductor component 181. Therefore, the first semiconductor component 182 and the second semiconductor component 181 are electrically connected to each other without using an internal connection terminal (e.g., a solder ball), thereby reducing a thickness of the electronic apparatus 198.

In addition, because the first semiconductor component 182 and the second semiconductor component 181 are electrically connected with each other via the through electrodes 187 through 189, reliability of electrical connection between the first semiconductor component 182 and the second semiconductor component 181 can be improved when being compared with a case where the first semiconductor component 182 and the second semiconductor component 181 are connected with each other via the internal connection terminal, for example, a solder ball.

FIGS. 25 through 28 are explanatory views illustrating fabrication steps of fabricating the electronic apparatus according to the second embodiment of the present invention. In the drawings, the same or corresponding reference symbols are given to the same or corresponding components or parts as those of the electronic apparatus 10 according to the first embodiment.

Referring to FIGS. 25 through 28, a fabrication method of the electronic apparatus 180 according to the second embodiment of the present invention is explained. First, substantially the same steps explained with reference to FIGS. 14 through 17 are carried out twice, thereby fabricating the first semiconductor component 182 and the second semiconductor component 181 (first semiconductor component forming step and second semiconductor component forming step).

Figure 25:
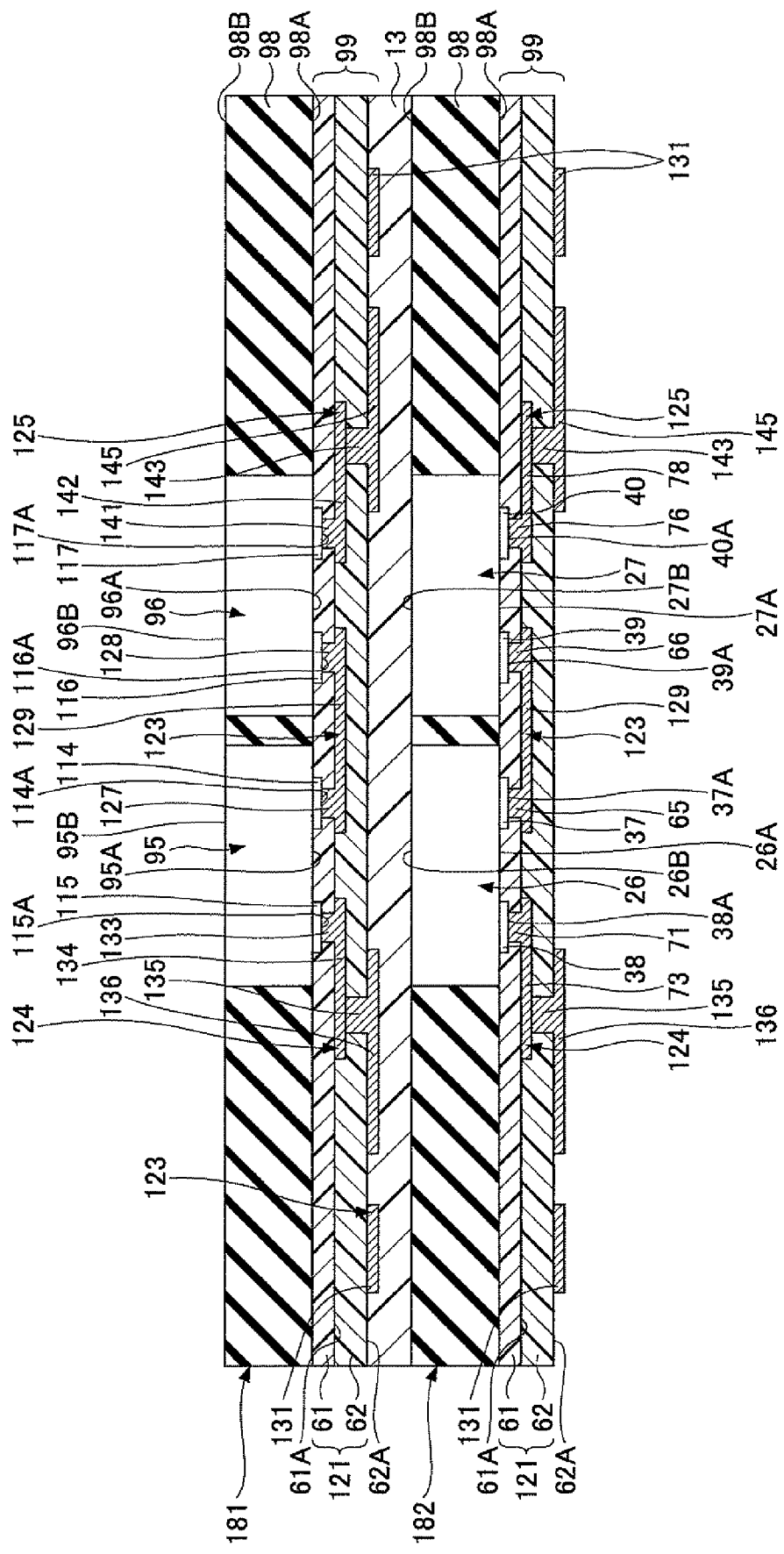
FIG. 25 is an explanatory view (part 1) for explaining a method of fabricating an electronic apparatus according to a second embodiment of the present invention.

Next, in a step illustrated in FIG. 25, the second semiconductor component 181 is attached on the first semiconductor component 182 via the adhesion layer 13 (semiconductor component attaching step). Specifically, the first semiconductor component 182 and the second semiconductor component 181 are attached by applying an adhesive between the first semiconductor component 182 and the second semiconductor component 181 so that the first back surfaces 26B, 27B of the corresponding first electronic parts 26, 27 oppose the multilayer wiring structure 99 of the second semiconductor component 181.

The adhesion layer 13 may be made of, for example, an insulation resin having adhesiveness (e.g., epoxy resin). A thickness of the adhesion layer 13 may be about 50 μm.

Figure 26:
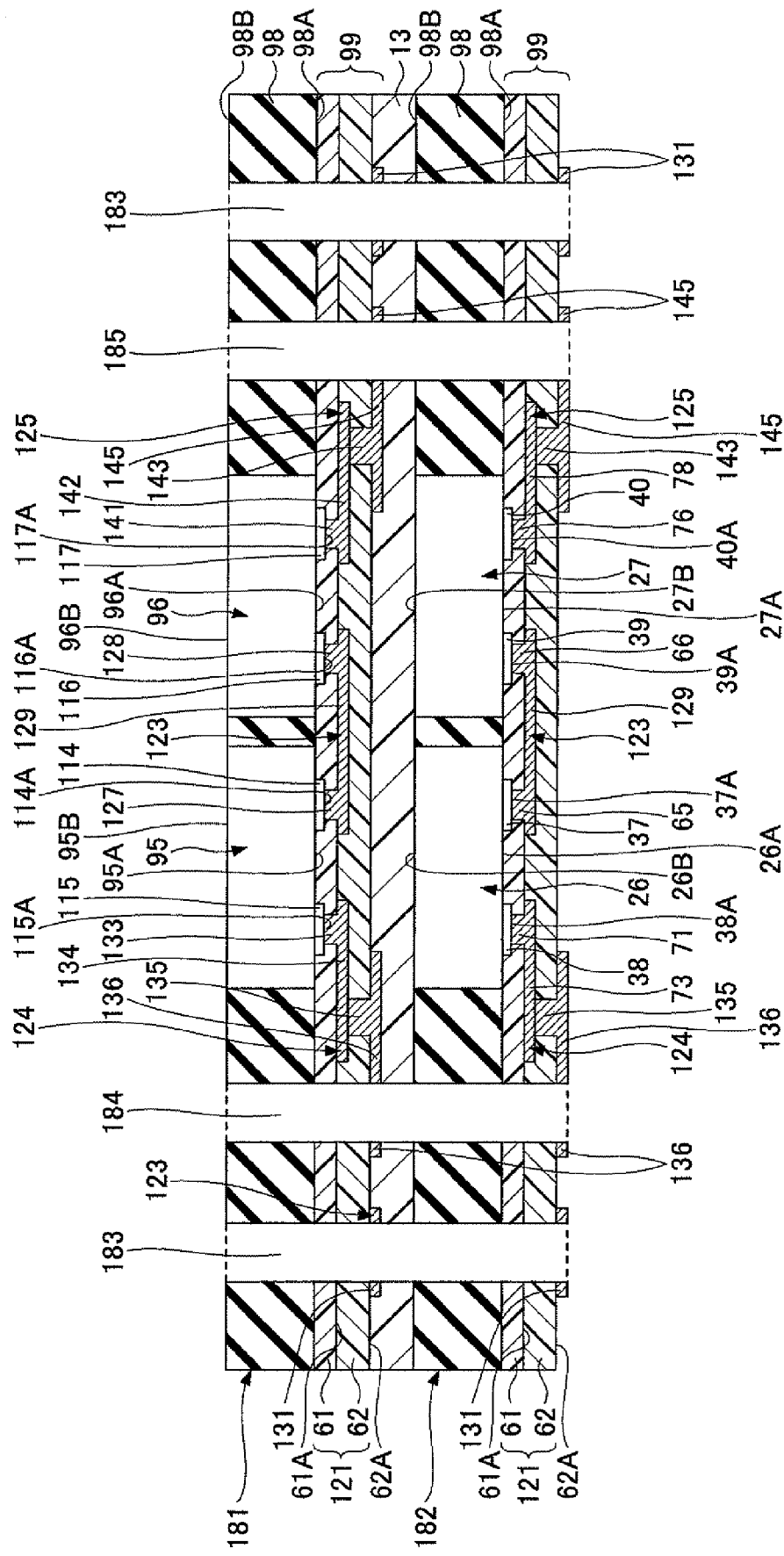
FIG. 26 is an explanatory view (part 2) for explaining the method of fabricating the electronic apparatus according to the second embodiment of the present invention.
Figure 27:
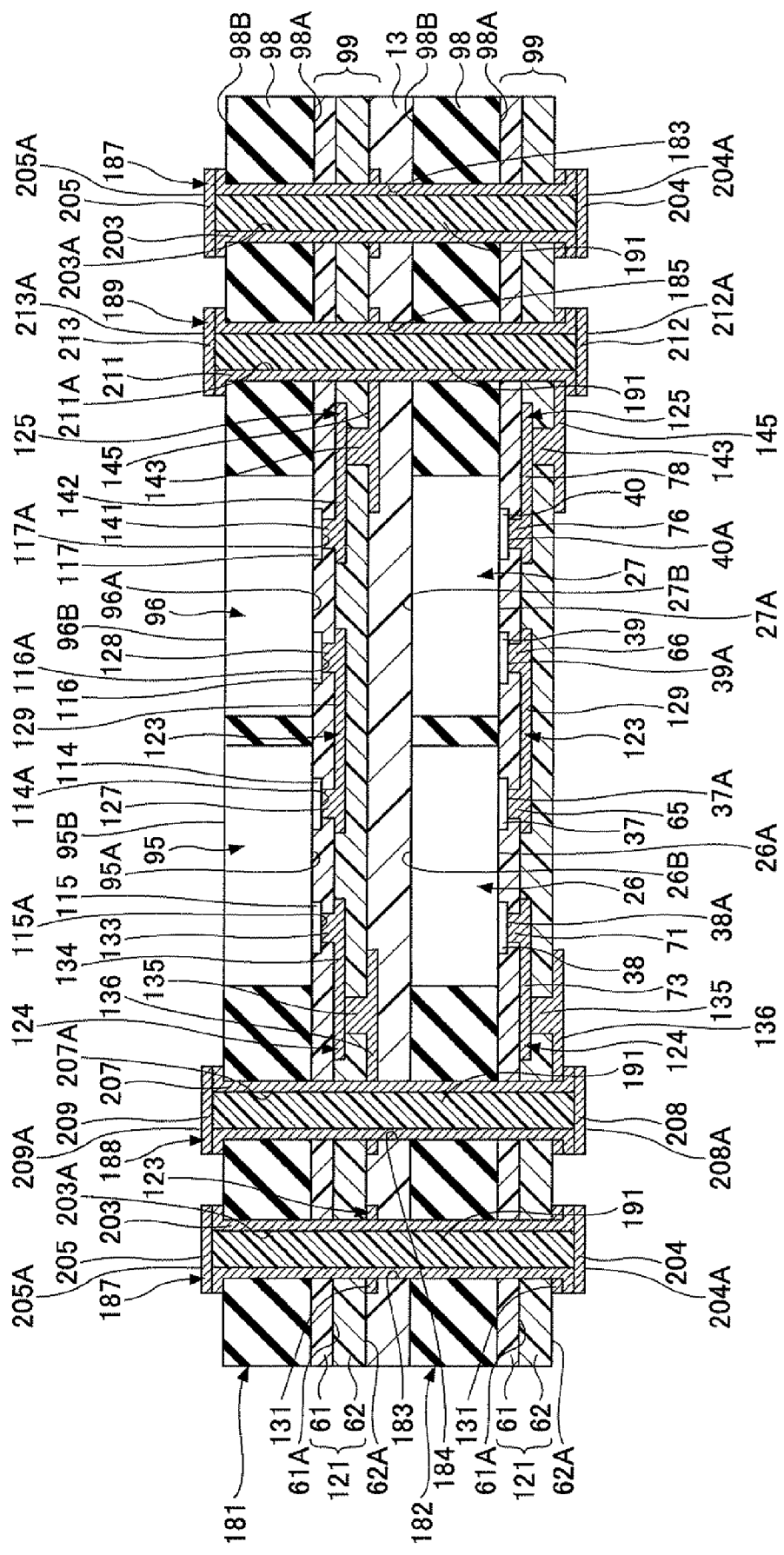
FIG. 27 is an explanatory view (part 3) for explaining the method of fabricating an electronic apparatus according to the second embodiment of the present invention.

Next, the through holes 183 through 185 are formed in a step (through hole forming step) illustrated in FIG. 26.

The through hole 183 is formed to go through the insulation member 98, the multilayer wiring structure 99, the wiring 131, which are provided in the second semiconductor component 181; the adhesion layer 13; and the insulation member 98, the multilayer wiring structure 99, the wiring 131, which are provided in the first semiconductor component 182.

The through hole 184 is formed to go through the insulation member 98, the multilayer wiring structure 99, the wiring 136, which are provided in the second semiconductor component 181; the adhesion layer 13; and the insulation member 98, the multilayer wiring structure 99, the wiring 136, which are provided in the first semiconductor component 182.

The through hole 185 is formed to go through the insulation member 98, the multilayer wiring structure 99, the wiring 145, which are provided in the second semiconductor component 181; the adhesion layer 13; and the insulation member 98, the multilayer wiring structure 99, the wiring 145, which are provided in the first semiconductor component 182. A diameter of the through hole 185 may be, for example, about 100 μm.

The through holes 183 through 185 are formed by, for example, laser machining.

Next, the through electrodes 187 through 189 are formed in the corresponding through holes 183 through 185, and the through holes 203A, 207A, 211A are filled with the resins 191 (through electrode forming step).

With this, the through electrode 187 is connected to the wiring 131 of the first semiconductor component 182 and the wiring 131 of the second semiconductor component 181. The through electrode 188 is connected to the wiring 136 of the first semiconductor component 182 and the wiring 136 of the second semiconductor component 181. The through electrode 189 is connected to the wiring 145 of the first semiconductor component 182 and the wiring 145 of the second semiconductor component 181.

The through electrodes 187 through 189 are formed by a combination of a nonelectrolytic plating method and an electrolytic plating method. The through electrodes 187 through 189 may be made of, for example, copper. The resin 191 may be made of, for example, an epoxy resin.

Figure 28:
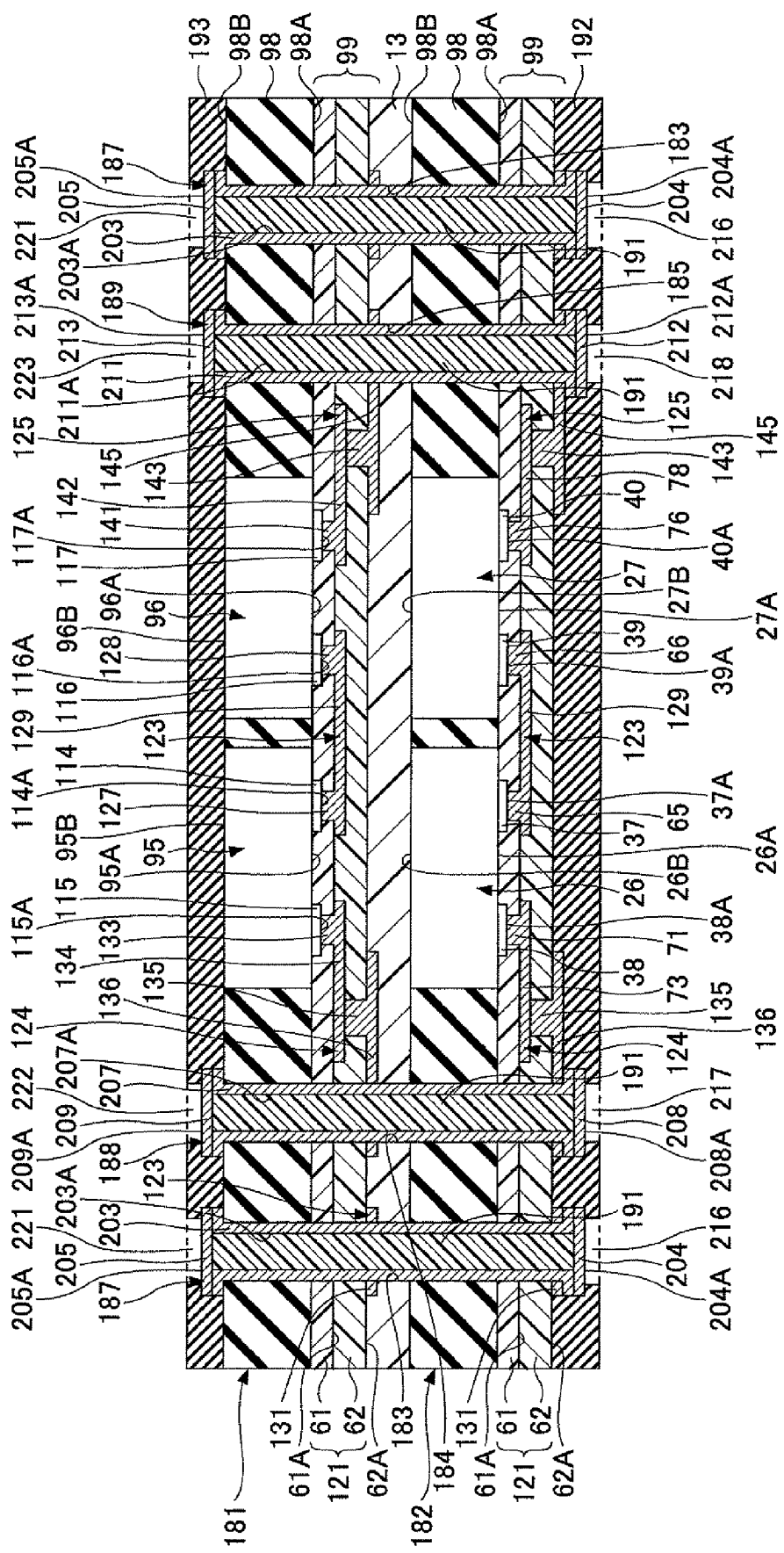
FIG. 28 is an explanatory view (part 4) for explaining the method of fabricating the electronic apparatus according to the second embodiment of the present invention.

Next, the solder resist layer 192 having the openings 216 through 218 is formed on the plane 62A of the insulation layer 62 of the first semiconductor component 182 and the wirings 136, 145, and the solder resist layer 193 having the openings 221 through 223 is formed on the plane 98B of the insulation member 98 of the second semiconductor component 181 in a step illustrated in FIG. 28. With this, the electronic apparatus 180 according to the second embodiment is fabricated.

The opening 216 is formed so that the connection surface 204A is exposed. The opening 217 is formed so that the connection surface 208A is exposed. The opening 218 is formed so that the connection surface 212A is exposed. The opening 221 is formed so that the connection surface 205A is exposed. The opening 222 is formed so that the connection surface 213A is exposed.

According to the fabrication method of this embodiment, the first semiconductor component 182 and the second semiconductor component 181 are attached by the adhesion layer 13; the through hole 183 that goes through the first semiconductor component 182 including the wiring 131 and the second semiconductor component 181 including the wiring 131, the through hole 184 that goes through the first semiconductor component 182 including the wiring 136 and the second semiconductor component 181 including the wiring 136, and the through hole 185 that goes through the first semiconductor component 182 including the wiring 145 and the second semiconductor component 181 including the wiring 145 are formed; the through electrode 187 connected to the wiring 131, the through electrode 188 connected to the wiring 136, and the through electrode 189 connected to the wiring 145 are formed in the corresponding through holes 183, 184, 185. Therefore, the first semiconductor component 182 and the second semiconductor component 181 are electrically connected with each other without using an internal connection terminal (e.g., a solder ball), thereby reducing a thickness of the electronic apparatus 180.

In addition, because the first semiconductor component 182 and the second semiconductor component 181 are electrically connected with each other via the through electrodes 187 through 189, reliability of electrical connection between the first semiconductor component 182 and the second semiconductor component 181 can be improved when being compared with a case where the first semiconductor component 182 and the second semiconductor component 181 are connected with each other via the internal connection terminal, for example, a solder ball.

While the present invention has been described with reference to the foregoing embodiments, the present invention is not limited to the disclosed embodiments, but may be modified or altered within the scope of the accompanying claims.

For example, three or more semiconductor components may be stacked.

The present application is based on Japanese priority application No. 2009-096741 filed on Apr. 13, 2009, with the Japanese Patent Office, the entire contents of which are hereby incorporated by reference.

What is claimed is:

1. An electronic apparatus comprising:
a first semiconductor component including
a first electronic part including a first electrode pad forming surface on which a first electrode pad is formed, and a first back surface opposing the first electrode pad forming surface,
a first insulation member including one surface and an opposing surface, the first insulation member sealing a side surface of the first electronic part,
a first multilayer wiring structure including plural insulation layers that are stacked one above another and a first patterned wiring, and
a first through electrode including an end part and configured to go through the first insulation member,
wherein the first patterned wiring is connected to the first electrode pad and the first through electrode;
a second semiconductor component including
a second electronic part including a second electrode pad forming surface on which a second electrode pad is formed, and a second back surface opposing the second electrode pad forming surface,
a second insulation member including one surface and an opposing surface, the second insulation member sealing a side surface of the second electronic part,
a second multilayer wiring structure including plural insulation layers that are stacked one above another and a second patterned wiring, and
a second through electrode that is provided on an inner surface of a first through hole formed to go through the second insulation member and the second multilayer wiring structure, and includes a second through hole formed in a center portion of the second through electrode,
wherein the second patterned wiring is connected to the second electrode pad and the second through electrode;
an adhesion layer provided between the opposing surface of the first insulation member and the second multilayer wiring structure; and
a third through electrode configured to fill the second through hole and a third through hole that is formed integrally with the second through hole in the adhesion layer;
wherein the first multilayer wiring structure is formed on the one surface of the first insulation member;
wherein the one surface of the first insulation member is substantially flush with the first electrode pad forming surface,
wherein the third through electrode has first and second ends, the first end of the third through electrode including an external connection pad portion that is protruded from the second insulation member, the second end of the third through electrode being connected to the end part of the first through electrode,
wherein the third through hole is configured to expose the end part of the first through electrode,
wherein the external connection pad portion is wider than a diameter of the second through hole.

2. The electronic apparatus of claim 1, wherein the first through hole is arranged to go through the second patterned wiring, and a side surface of the second through electrode is connected to the second patterned wiring.

3. The electronic apparatus of claim 1, wherein the opposing surface of the first insulation member, the first back surface of the first electronic part, and an end surface of the first through electrode provide substantially an identical planar surface.

4. The electronic apparatus as claimed in claim 1, wherein the first electrode pad forming surface and the first back surface of the first electronic part are exposed at the one surface and the opposing surface, respectively, of the first insulation member.

5. The electronic apparatus as claimed in claim 1, wherein the plural insulation layers of the first multilayer wiring structure cover the one surface of the first insulation member and the first electrode pad forming surface.

6. The electronic apparatus as claimed in claim 1, wherein the second electrode pad forming surface and the second back surface of the second electronic part are exposed at the one surface and the opposing surface, respectively, of the second insulation member.

7. The electronic apparatus as claimed in claim 1, wherein the plural insulating layers of the second multilayer wiring structure cover the one surface of the second insulation member and the second electrode pad forming surface.

8. The electronic apparatus as claimed in claim 1, wherein the third through electrode is configured to fill the entire second through hole.

* * * * *